US008735750B2

(12) United States Patent
Ng et al.

(10) Patent No.: US 8,735,750 B2
(45) Date of Patent: May 27, 2014

(54) SWITCHING DEVICE AND A METHOD FOR FORMING A SWITCHING DEVICE

(75) Inventors: Jiaqiang Eldwin Ng, Singapore (SG); Ming Lin Julius Tsai, Singapore (SG); Navab Singh, Singapore (SG); Nansheng Shen, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 264 days.

(21) Appl. No.: 13/373,123

(22) Filed: Nov. 3, 2011

(65) Prior Publication Data
US 2012/0138437 A1    Jun. 7, 2012

(30) Foreign Application Priority Data

Nov. 4, 2010    (SG) ................................. 201008259-2

(51) Int. Cl.
*H01H 57/00* (2006.01)

(52) U.S. Cl.
USPC ....................................................... 200/181

(58) Field of Classification Search
USPC .......... 200/181, 600, 16 D; 458/684; 438/685; 488/903
See application file for complete search history.

(56) References Cited

U.S. PATENT DOCUMENTS

| 6,990,009 B2 | 1/2006 | Bertin et al. |
| 7,446,044 B2 | 11/2008 | Kaul et al. |
| 8,125,131 B2 * | 2/2012 | Kolake et al. ................. 313/310 |
| 8,338,296 B2 * | 12/2012 | Sriraman et al. .............. 438/674 |
| 2009/0207717 A1 | 8/2009 | van Kampen |

OTHER PUBLICATIONS

B. Yang et al. "Vertical Silicon-Nanowire Formation and Gate-All-Around MOSFET," Elec. Dev. Lett, vol. 28, No. 7, Jul. 2008.
W. Y. Choi, H. Kam, D. Lee, J. Lai, T.-J. K. Liu, "Compact Nano-Electro-Mechanical Non-Volatile Memory (NEMory) for 3D Integration," IEDM 2007, pp. 603-606.
S. Bhunia, M. Tabib-Azar, D. Saab. "Ultralow-Power Reconfigurable Computing with Complementary Nano-Electromechanical Carbon Nanotube Switches," ASP-DAC 2007, pp. 86-91. Jan 2007.
A. B. Kaul, E. W. Wong, L. Epp, and B. D. Hunt, "Electromechanical Carbon Nanotube Switches for High-Frequency Applications," Nano Lett., vol. 6, No. 5, pp. 942-947. 2006.
A. B. Kaul, E. W. Wong, L. Epp, M. J. Bronikowski, B. D. Hunt. "Air Bridge and Vertical Carbon Nanotube Switches for High Performance Switching Applications," Mater. Res. Soc. Symp., vol. 924, pp. 0924-Z060-04, 2006.
J. E. Jang et al. "Nanoscale memory cell based on a nanoelectromechanical switched capacitor," Nature Nanotech., vol. 3 (1), pp. 26-30, 2007.
F. Chen et al. "Integrated Circuit Design with NEM Relays," ICCAD Proc. 2008, pp. 750-757.

(Continued)

*Primary Examiner* — Edwin A. Leon
*Assistant Examiner* — Anthony R. Jimenez
(74) *Attorney, Agent, or Firm* — K. David Crockett, Esq.; Niky Economy Syrengelas, Esq.; Crockett & Crockett, PC

(57) ABSTRACT

Embodiments provide a switching device. The switching device includes a substrate, which includes a contact region. The switching device further includes a vertical layer arrangement extending from the substrate next to the contact region. The vertical layer arrangement includes a control layer. The switching device further includes a freestanding silicon cantilever extending vertically from the contact region.

8 Claims, 33 Drawing Sheets

(56) References Cited

OTHER PUBLICATIONS

K. Akarvardar and H.-S. P. Wong. "Ultralow Voltage Crossbar Nonvolatile Memory Based on Energy-Reversible NEM switches" Elec. Dev. Lett. vol. 30, No. 6, pp. 626-628. Jun. 2009.

J. O. Lee et al. "3-Terminal Nanoelectromechanical Switching Device in Insulating Liquid Media for Low Voltage Operation and Reliability Improvement," IEDM 2009, pp. 227-230.

W. W. Jang et al. "Fabrication and characterization of a nanoelectromechanical switch with 15-nm-thick suspension air gap," App. Phys. Lett. 92, 103110, 2008.

14. W. W. Jang et al. "NEMS switch with 30 nm-thick beam and 20 nm-thick air-gap for high density non-volatile memory applications," Solid-State Elec. 52, pp. 1578-1583, 2008.

J. E. Jang et al. "Nanoelectromechanical switches with vertically aligned carbon nanotubes," App. Phys. Lett. 87, 163113, 2005.

B. A. Cruden and A. M. Cassell. "Vertically Oriented Carbon Nanofiber Based Nanoelectromechanical Switch," IEEE Trans. Nanotech., vol. 5, No. 4, Jul. 2006.

* cited by examiner though the emphasis is being placed upon illustrating the principles of the invention. In the following description, various embodiments of the invention are described with reference to the following drawings, in which:

SWITCHING DEVICE AND A METHOD FOR FORMING A SWITCHING DEVICE

The present application claims the benefit of the Singapore patent application 201008259-2 (filed on 4 Nov. 2010), the entire contents of which are incorporated herein by reference for all purposes.

Field of the Inventions

Embodiments relate generally to a switching device and a method for forming a switching device.

BACKGROUND OF THE INVENTIONS

Nanoelectromechanical (NEM) switches have been proposed by many for non-volatile memory applications because of their low power consumption and nanosecond range switching speeds, which translate to write or erase speeds several orders of magnitude faster than NAND Flash. NEM switches have been also suggested as an answer to the high leakage current limitation of scaling CMOS transistors further. NEM switches offer zero leakage, high sub-threshold slopes and are an attractive for scaling as well as low power computing. Furthermore, NEM switches are able to withstand harsh environments (high temperatures and radiation dosages), and such properties may prove invaluable for computing or memory in automotive, offshore, or space applications.

A major challenge of NEM switches has been their density—horizontally oriented cantilever NEM switches with CMOS-compatible processes have been demonstrated for memory use, but these traditionally incur a large area footprint, making them expensive for memory or computing usage. Vertically oriented switches have been proposed previously based on multiwall carbon nanotubes (MWCNTs), but the mass fabrication of these remains difficult and costly.

SUMMARY

Various embodiments provide a switching device and a method for forming a switching device which solve at least partially the above mentioned problems associated with the prior art.

In one embodiment, a switching device is provided. The switching device may include a substrate. The substrate may include a contact region. The switching device may further include a vertical layer arrangement extending from the substrate next to the contact region, wherein the vertical layer arrangement includes a control layer. The switching device may further include a freestanding silicon cantilever extending vertically from the contact region.

In one embodiment, a method for forming a switching device on a substrate is provided. The method may include forming a fin on the substrate. The method may further include covering the fin with covering material. The method may further include forming a vertical layer arrangement adjacent to the covered fin. The method may further include removing the covering material such that at least a part of the fin remains as freestanding cantilever next to the vertical layer arrangement.

BRIEF DESCRIPTION OF THE DRAWINGS

In the drawings, like reference characters generally refer to the same parts throughout the different views. The drawings are not necessarily to scale, emphasis instead generally being

FIGS. 3(a) to (f) show the fabrication process of the switching device shown in FIG. 2(a), wherein:

FIG. 3(a) shows that a silicon fin is formed;

FIG. 3(b) shows that silicon nitride strip is deposited over the structure shown in FIG. 3(a) according to a pattern;

FIG. 3(c) shows that local oxidation (LOCOS) is carried out for to the structure shown in FIG. 3(b) and thereafter the nitride strip is removed;

FIG. 3(d) shows that a layer of oxide is deposited over the structure shown in FIG. 3(c);

FIG. 3(e) shows that polysilicon is deposited over the structure shown in FIG. 3(d), and thereafter the top surface of the structure is planarized such that the oxide over the fin and the top of silicon cantilever within the fin are exposed;

FIG. 3(f) shows that the oxide of the fin is released;

FIGS. 11(a) to (v) illustrate the fabrication process of the switching device as shown in FIG. 10(a) according to an exemplary embodiment, wherein:

FIG. 11(a) shows that a silicon nanofin is formed on a substrate;

FIG. 11(b) shows that the structure shown in FIG. 11(a) is deposited with silicon nitride followed by being deposited with oxide;

FIG. 11(c) shows that polysilicon is deposited over the structure shown in FIG. 11(b) and thereafter the top surface of the structure is planarized to expose the oxide over the nanofin;

FIG. 11(d) shows that a first mask which defines a pattern region is placed over the structure shown in FIG. 11(c);

FIG. 11(e) shows that the polysilicon not covered by the first mask is etched away;

FIG. 11(f) shows that the oxide not covered by the first mask is etched away;

FIG. 11(g) shows that the first mask is stripped off;

FIG. 11(h) shows that the silicon nitride outside of the pattern region is etched away;

FIG. 11(i) shows that the polysilicon and the oxide within the pattern region are etched away;

FIG. 11(j) shows that thermal oxidation is carried out for the structure shown in FIG. 11(i);

FIG. 11(k) shows the silicon nitride in the pattern region is stripped off;

FIG. 11(l) shows that oxide is deposited over the structure shown in FIG. 11(k);

FIG. 11(m) shows that polysilicon is deposited over the structure shown in FIG. 11(l) and the top surface of the structure is further planarized to expose oxide over the nanofin;

FIG. 11(n) shows that a second mask is placed to cover the oxide over the nanofin;

FIG. 11(o) shows that part of the polysilicon on both side of the nanofin is etched away;

FIG. 11(p) shows the second mask is stripped off;

FIG. 11(q) shows that the oxide over the nanofin is partially etched away;

FIG. 11(r) shows the cross section view of the structure shown in FIG. 11(q);

FIG. 11(s) shows oxide is deposited over the structure shown in FIG. 11(q);

FIG. 11(t) shows that polysilicon is deposited over the structure shown in FIG. 11(s) and the top surface of the structure is further planarized to expose the oxide over the nanofin and the top of the silicon cantilever within the nanofin;

FIG. 11(u) shows that the oxide of the nanofin is released;

FIG. 11(v) shows the cross section view of the structure shown in FIG. 11(u);

FIGS. 11(a) to (k) and FIGS. 12(l) to (t) illustrate the fabrication process of the switching device as shown in FIG. 10 (a) according to an exemplary embodiment, wherein FIG. 12(l) shows oxide is deposited over the structure shown in FIG. 11(k);

FIG. 12(m) shows polysilicon is deposited over the structure shown in FIG. 12(l) and thereafter the top surface of the structure is planarized to expose oxide over the nanofin;

FIG. 12(n) shows a third mask is placed over the top surface of the structure shown in FIG. 12(m) to cover the oxide over the nanofin;

FIG. 12(o) shows that the polysilicon on both sides of the nanofin is partially etched away;

FIG. 12(p) shows that the third mask is removed;

FIG. 12(q) shows that oxide is deposited over the structure shown in FIG. 12(p);

FIG. 12(r) shows that polysilicon is deposited over the structure shown in FIG. 12(q) and thereafter the top surface of the structure is planarized to expose the oxide over the nanofin and the top of the silicon cantilever within the nanofin;

FIG. 12(s) shows that the oxide of the nanofin is released;

FIG. 12(t) shows the cross section view of the structure shown in FIG. 12(s);

FIGS. 13(a) to (d) illustrate the fabrication of an array of switching devices according to an exemplary embodiment, wherein:

FIG. 13(a) shows a plurality of nanofins are formed over a substrate;

FIG. 13(b) shows that a plurality of silicon nitride is deposited over the structure shown in FIG. 13(a) according to a pattern;

FIG. 13(c) shows that thermal oxidation is carried out for the structure shown in FIG. 13(b) and thereafter the nitride strips are removed;

FIG. 13(d) shows that oxide is deposited over the structure shown in FIG. 13(c) followed by deposition of polysilicon;

DETAILED DESCRIPTION OF THE INVENTIONS

Figure 1:
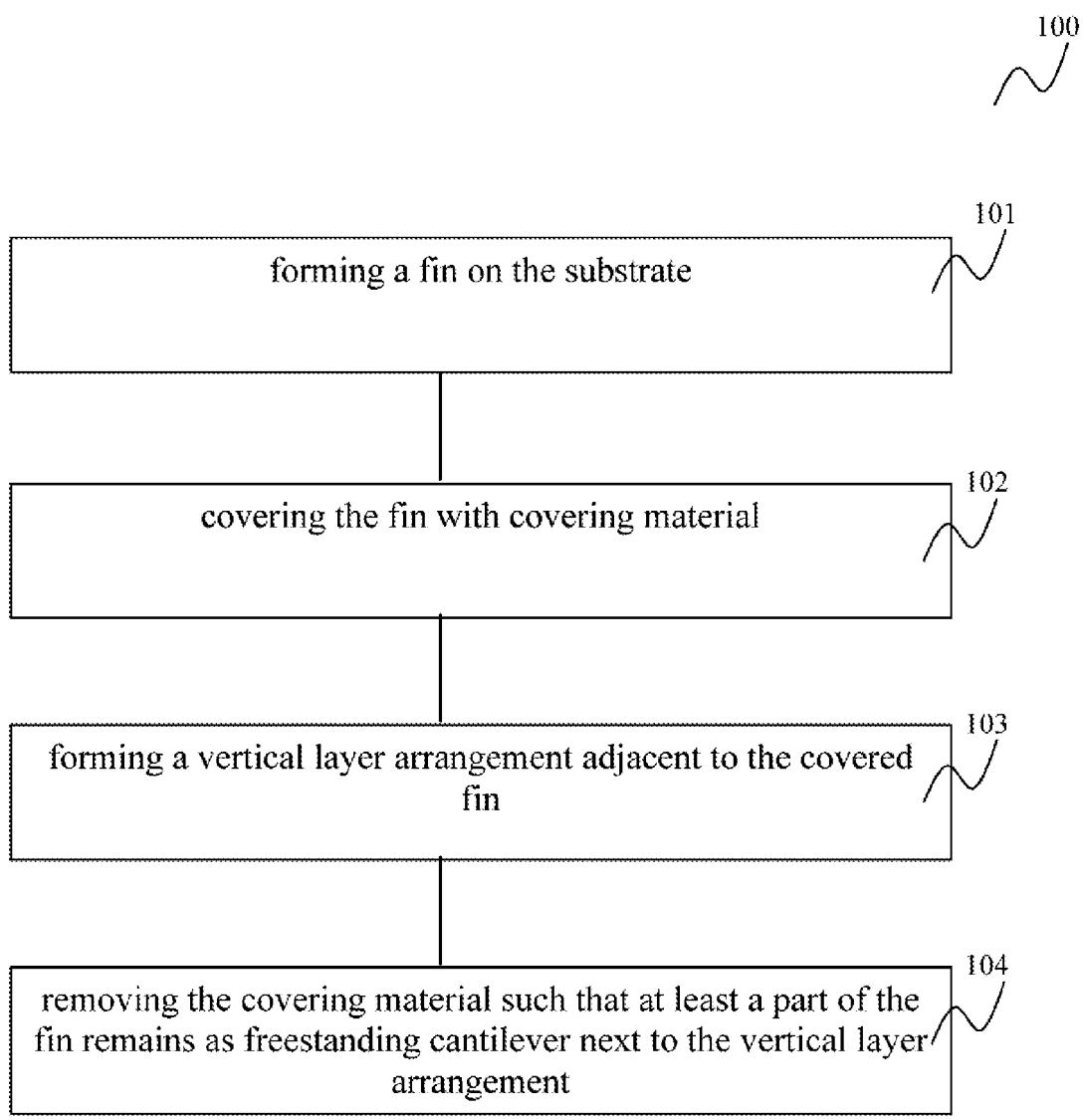
FIG. 1 shows a method for forming a switching device according to one embodiment.

The following detailed description refers to the accompanying drawings that show, by way of illustration, specific details and embodiments in which the invention may be practiced. These embodiments are described in sufficient detail to enable those skilled in the art to practice the invention. In this regard, directional terminology, such as "top", "bottom", "front", "back", "leading", "trailing", etc, is used with reference to the orientation of the Figure(s) being described. Because components of embodiments can be positioned in a number of different orientations, the directional terminology is used for purposes of illustration and is in no way limiting. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore, is not to be taken in a limiting sense, and the scope of the present invention is defined by the appended claims.

The word "exemplary" is used herein to mean "serving as an example, instance, or illustration". Any embodiment or design described herein as "exemplary" is not necessarily to be construed as preferred or advantageous over other embodiments or designs.

In one embodiment, a switching device is provided. The switching device may include a substrate, a vertical layer arrangement, and a freestanding silicon cantilever. The substrate may include a contact region. The vertical layer arrangement may extend from the substrate next to the contact region, and the vertical layer arrangement may include a control layer. The freestanding silicon cantilever may extend vertically from the contact region.

In one embodiment, in other words, the switching device may include a substrate which has a contact region. The switching device may further include a freestanding silicon cantilever which extends at least substantially orthogonally to the substrate from the contact region. The switching device may further include a vertical arrangement of layers. The vertical arrangement of layers may extend at least substantially orthogonally from the substrate next to the contact region. That is, the vertical layer arrangement may be next to the freestanding silicon cantilever. Each layer of the vertical arrangement of layers may be at least substantially parallel to the substrate. The vertical arrangement of layers may include a control layer. The control layer may be used to control the movement of the cantilever. For example, by applying appropriate voltages to the contact region of the substrate and the control layer respectively, an electrostatic force may exist between the cantilever and the control layer which may cause the cantilever to flip to one side, e.g. towards the vertical arrangement of layers. In this context, the control layer may be referred to as a fixed electrode or gate or gate electrode. The cantilever may be referred to as a switch element.

In one embodiment, the vertical layer arrangement further includes a contact layer and the cantilever extends vertically next to the control layer and the contact layer of the layer arrangement. For example, a voltage difference may be applied between the contact region of the substrate and the control layer, such that an electrostatic force exists between the cantilever and the control layer. The electrostatic force may cause the cantilever to flip towards the vertical layer arrangement and to contact the contact layer of the vertical layer arrangement. In one example, the contact layer may be located between the substrate and the control layer. Illustratively, the contact layer may be closer to the cantilever than the control layer.

In one embodiment, the cantilever may be adapted such that it can be brought into contact electrostatically with the contact layer by applying a voltage difference between the contact region and the control layer. In a further embodiment, the cantilever may be adapted such that when it has been brought into contact with the contact layer it stays in contact with the contact layer when the voltage is no longer applied. In this embodiment, the cantilever may be adapted such that it stays in contact by means of van der Waals force and/or Casimir effect.

In one embodiment, substrate is silicon.

In one embodiment, the cantilever may be electrically connected and mechanically fixed to the contact region. For example, the cantilever may be integrally formed with the substrate.

In one embodiment, the switching device may further include a further vertical layer arrangement formed on the substrate next to the contact region opposite the vertical layer arrangement. The further vertical layer arrangement may include a further contact layer and a further control layer. The cantilever may extend between the vertical layer arrangement and the further vertical layer arrangement. For example, by applying a voltage difference between the control layer and the contact region of the substrate, the cantilever may be caused to flip towards the vertical layer arrangement, and may be in contact with the contact layer. By applying a voltage difference between the further control layer and the contact region of the substrate, the cantilever may be caused to flip towards the further vertical layer arrangement, and may be in contact with the further contact layer.

In one embodiment, the cantilever is adapted such that it can be brought electrostatically in contact with the further contact layer by applying a voltage difference between the contact region and the further control layer.

FIG. 1 shows a method 100 for forming a switching device on a substrate in one embodiment. The method 100 may include 101 forming a fin on the substrate. The method may further include 102 covering the fin with covering material. The method 100 may further include 103 forming a vertical layer arrangement adjacent to the covered fin. The method 100 may further include 104 removing the covering material such that at least a part of the fin remains as freestanding cantilever next to the vertical layer arrangement. The method 100 may be used to form a switching device as described herein.

Illustratively, for the switching device formed using the method 100, when a voltage difference is applied between the freestanding cantilever and a layer of the vertical layer arrangement, the freestanding cantilever may flip towards one side under an electrostatic force.

In one embodiment, the vertical layer arrangement is abutting the covered fin.

In one embodiment, the method 100 further includes forming a further vertical layer arrangement adjacent to the covered fin and removing the covering material such that the part of the fin remains as a freestanding cantilever between the vertical layer arrangement and the further vertical layer arrangement.

In one embodiment, the method 100 further includes processing the fin before 102 covering the fin with covering material. Processing the fin may include masking the part of the fin which is to remain freestanding to withstand oxidation. In a further embodiment, removing the covering material includes removing oxidated parts of the fin such that the masked part of the fin remains freestanding.

In one embodiment, the covering material is an oxide material.

In one embodiment, the fin is formed from silicon.

In one embodiment, the fin is at least partly formed on a contact region of the substrate and the vertical layer arrangement is formed to include a contact layer and a control layer. In a further embodiment, at least one of the contact region, the contact layer, and the control layer is formed of silicon. In one embodiment, the vertical layer arrangement is formed such that the contact layer and the control layer are isolated by an isolating layer. In an exemplary embodiment, the isolating layer is an oxide layer.

Figure 2:
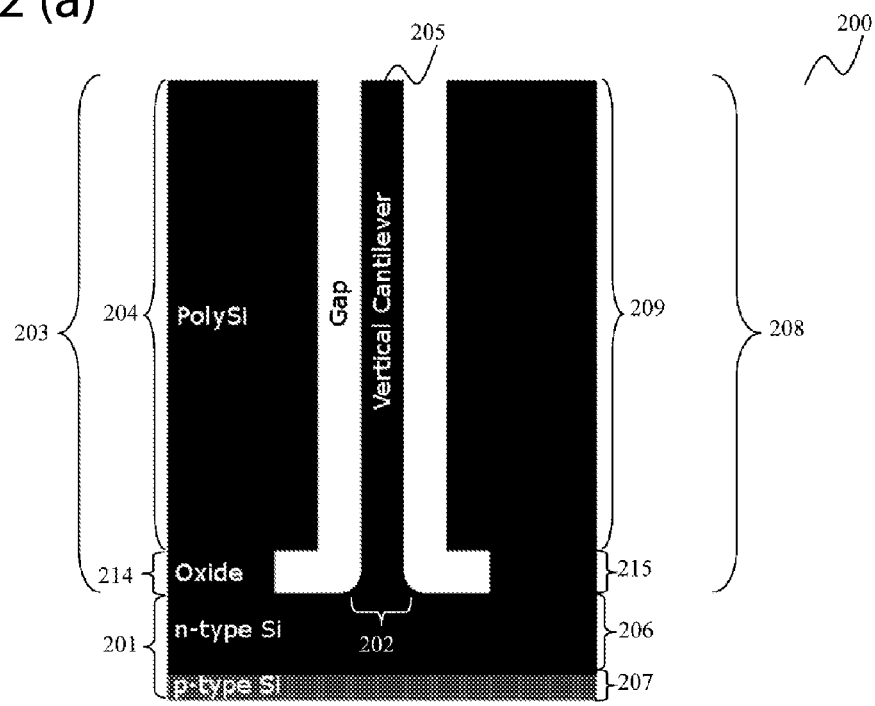
FIG. 2(a) shows the cross section view of a switching device according to one exemplary embodiment.
FIG. 2(b) shows the cantilever of the switching device shown in FIG. 2(a) is brought into contact with a control layer.
FIG. 2(c) shows the perspective view of the switching device shown in FIG. 2(a)
FIG. 2(d) illustrates the cantilever of the switching device shown in FIG. 2(a) is movable among different configurations.
Figure 2:
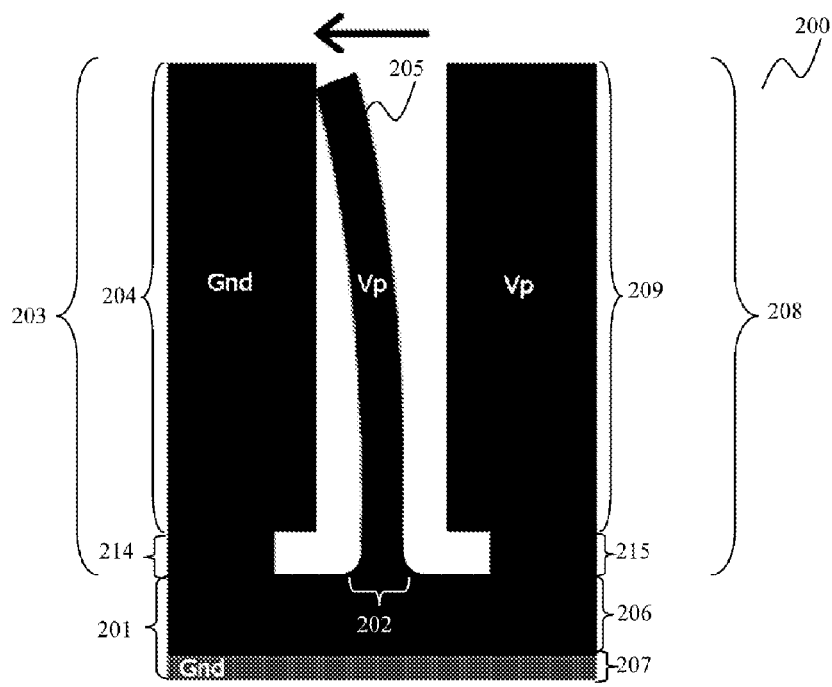
Figure 2:
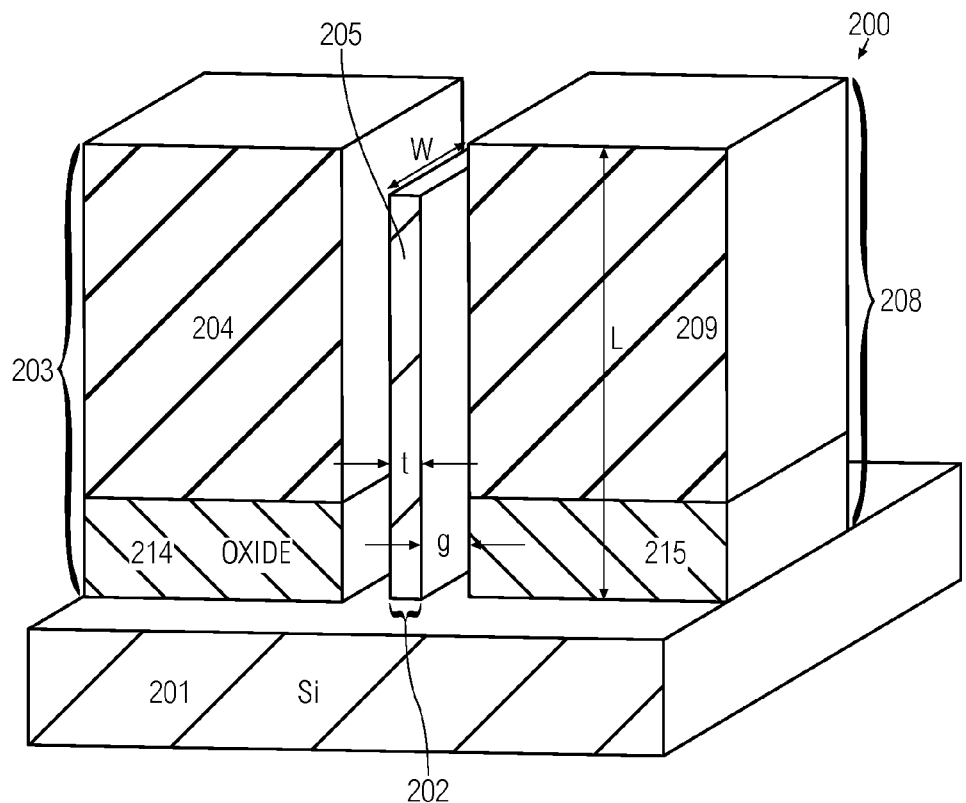
Figure 2:
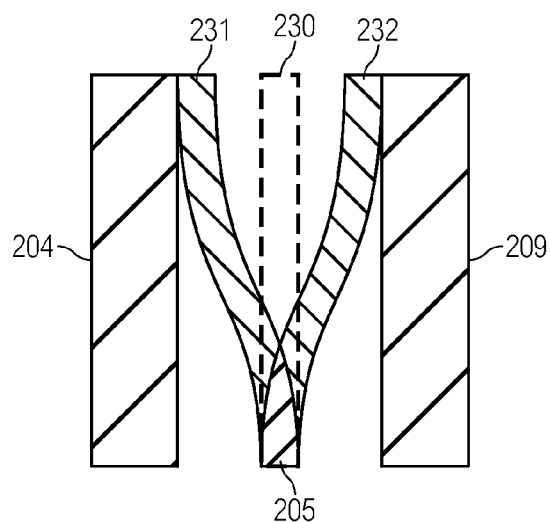
Figure 3:
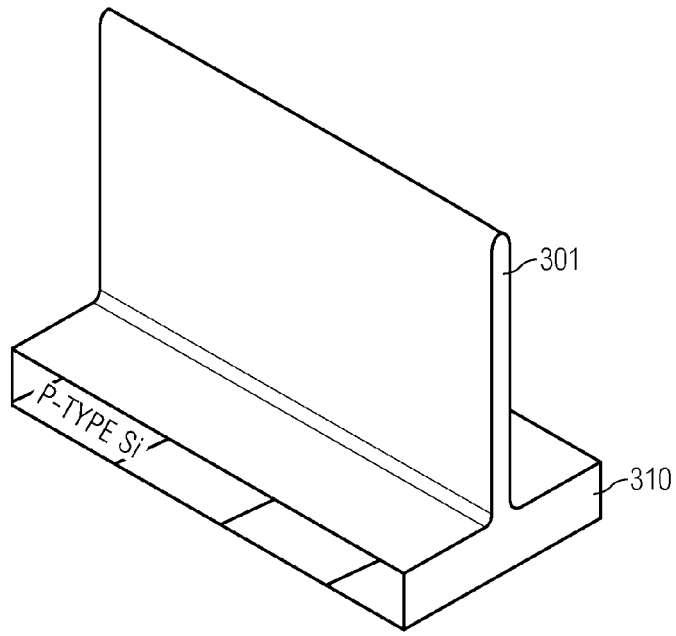
Figure 3:
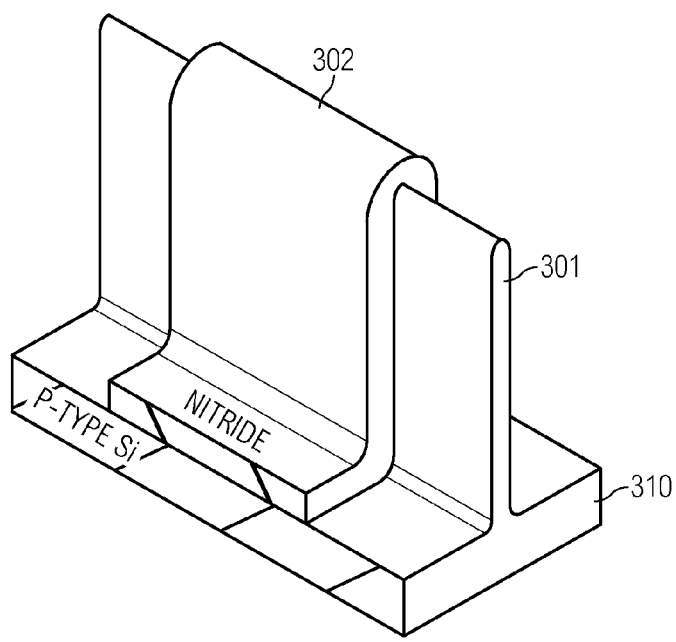
Figure 3:
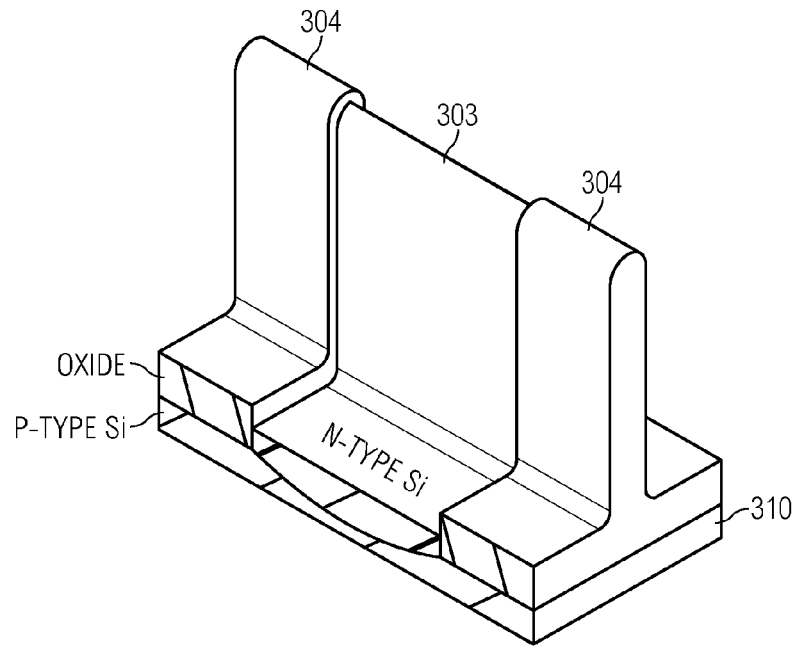
Figure 3:
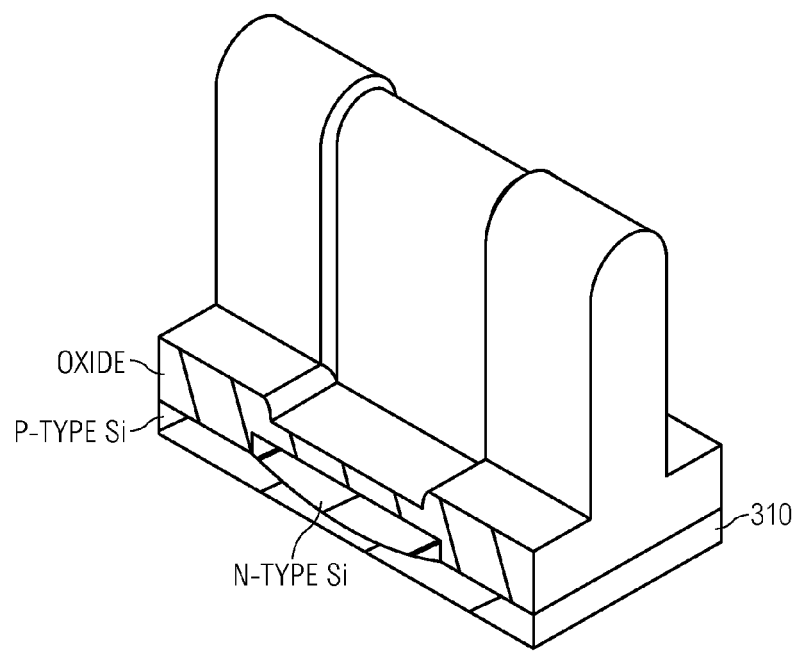
Figure 3:
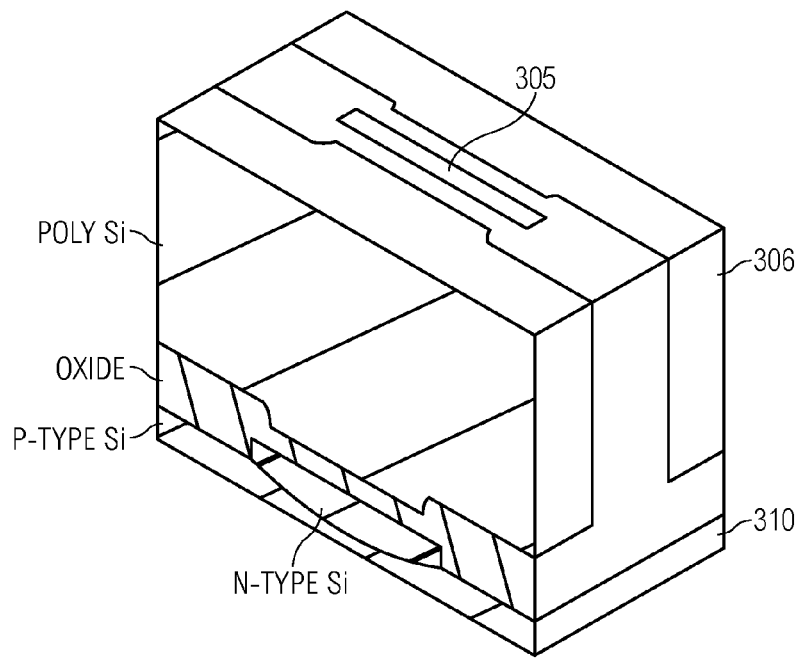
Figure 3:
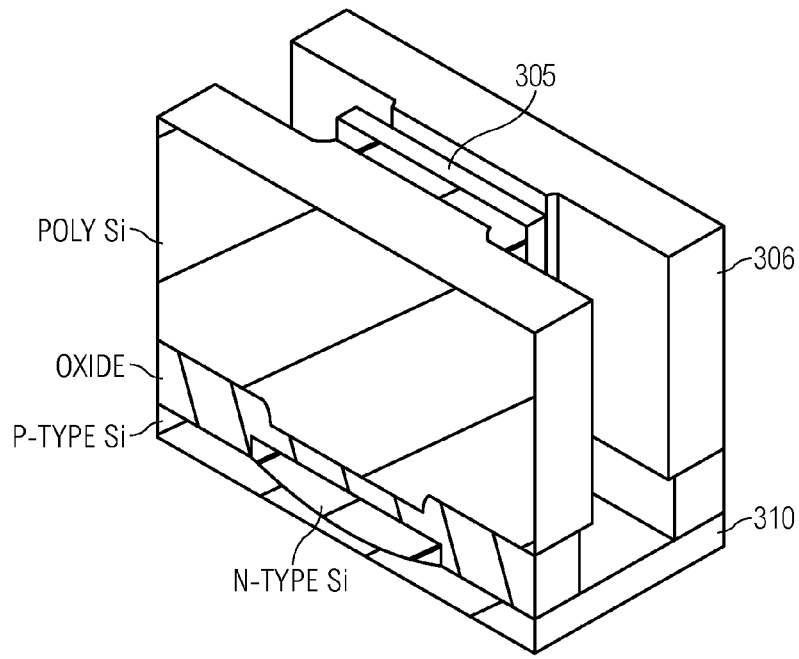

FIG. 2(a) shows the cross section view of a switching device 200 according to one exemplary embodiment. The switching device 200 includes a substrate 201 which has a contact region 202. The switching device 200 further includes a vertical layer arrangement 203 extending from the substrate 201 next to the contact region 202. The vertical layer arrangement 203 includes a control layer 204. Illustratively, the control layer 204 may be made of polysilicon. Alternatively, the control layer 204 may include a metal or a combination of metal and poly/amorphous-silicon. For a more detailed example, the control layer 204 may include two layers wherein one layer is metal and one layer is polysilicon or amorphous silicon. The control layer 204 may also be referred to as fixed electrode or gate or gate electrode. The vertical layer arrangement 203 may further include an isolating layer 214 located between the control layer 204 and the substrate 201. The isolating layer 214 may be an oxide material, e.g. silicon oxide and tetraethyl orthosilicate (TEO) oxide. The switching device 200 further includes a freestanding silicon cantilever 205 extending vertically from the contact region 202. The cantilever 205 extends vertically relative to the substrate next to the control layer 204, and is adapted such that the cantilever 205 can be brought into contact electrostatically with the control layer 204 by applying a voltage difference between the contact region 202 and the control layer 204 (see FIG. 2(b)). In this embodiment, the control layer 204 may also be referred to as a contact layer.

The cantilever 205 may be adapted such that when it has been brought into contact with the control layer 204, the cantilever 205 stays in contact with the control layer 204 when the voltage is no longer applied. The cantilever 205 is adapted such that it stays in contact by means of van der Waals force and/or Casimir effect.

The substrate 201 is silicon. Illustratively, the substrate 201 may include a layer of n-type silicon 206 on top of a layer of p-type silicon 207.

The cantilever 205 is electrically connected and mechanically fixed to the contact region 202. Illustratively, the cantilever 205 is integrally formed with the substrate 201.

The switching device 200 further includes a further vertical layer arrangement 208 formed on the substrate 201 next to the contact region 202 opposite the vertical layer arrangement 203. The further vertical layer arrangement 208 includes a further control layer 209 which may also be referred to as a fixed electrode or gate or gate electrode. The further vertical layer arrangement 208 may further include an isolating layer 215 located between the further control layer 209 and the substrate 201. The isolating layer 215 may be an oxide material, e.g. silicon oxide and TEOS oxide. The cantilever 205 extends between the vertical layer arrangement 203 and the further vertical layer arrangement 208. The cantilever 205 can be adapted such that it can be brought electrostatically in contact with the further control layer 209 by applying a voltage difference between the contact region 202 and the further control layer 209. In this embodiment, the further control layer 209 may also be referred to as a further contact layer.

The switching device 200 may also be referred to as a vertically oriented silicon nanoelectromechanical (NEM) switch. The silicon cantilever 205 may be seen as a switch element perpendicularly attached to the substrate 201, sandwiched with air gaps between two fixed electrodes 204 and 209. The switch element 205, initially in the neutral position at the center can be flipped to either side by applying appropriate voltages to the contact region 202 (or substrate 201) and the fixed electrode 204 or 209, such that a sufficiently strong electrostatic force exists between the cantilever 205 and the fixed electrode 204 or 209 and the cantilever 205 flips to one side. The minimum voltage at which this occurs is frequently called the pull-in voltage $V_{pi}$, given analytically for a parallel plate model:

$$V_{pi} = \sqrt{\frac{16Et^3g^3}{81\varepsilon_0 L^4}} \quad (1)$$

where E is Young's modulus, t is the thickness of the cantilever 205, g is the gap distance between the cantilever 205 and the fixed electrode 204 or 209, $\varepsilon_0$ is the permittivity of free space, and L is the length of the cantilever 205 (the denotations in FIG. 2(c)).

Once in contact, van der Waals or 'stiction' forces can hold the switch element in place (e.g. in contact with the contact layer 204 or 209) even when the voltage is released, serving the switching device 200 as a non-volatile memory. That is, the switching device may be used as a memory cell. The position of the cantilever 205 (e.g. contact or no contact with the contact layer 204) may be used to define a '0' or '1' that can be subsequently read. The memory cell may be reprogrammed by reversing the voltages applied on the fixed electrodes.

FIG. 2(c) shows the perspective view of the switching device shown in FIG. 2(a). Like reference numerals are used to denote like features.

FIG. 2(d) shows that the cantilever 205 may be brought into contact with the control layer 204 or the further control layer 209. Configuration 230 shows that at an initial state, the silicon cantilever 205 is at least substantially vertical to the substrate 201. Configuration 231 shows that the cantilever 205 is brought into contact with the control layer 204. Configuration 232 shows that the cantilever 205 is brought into contact with the further control layer 209.

Configuration 231 is achievable, for example, by applying a voltage difference between the control layer 204 and the cantilever 205. In other words, if the cantilever 205 is electrically connected to the contact region 202 of the substrate 201, configuration 231 is achievable by applying a voltage difference between the control layer 204 and the contact region 202. At the same time, the voltages applied to the cantilever 205 and the further control layer 209 may be set to be the same. When the voltage difference between the cantilever 205 and the control layer 204 is no longer applied, the cantilever 205 may remain to be in contact with the control layer 204 by means of forces such as van der Waals and Casimir effect etc. In other words, if the forces such as van der Waals forces are strong enough, the cantilever 205 remains in the configuration 231 when the voltage difference between the cantilever 205 and the control layer 204 is no longer applied. In this case, the switching device is suitable to be used in a memory, and the switching device 200 may be referred to as a memory cell. Alternatively, if the van der Waals forces are not strong enough, the cantilever 205 may return back to the configuration 230 when the voltage difference between the cantilever 205 and the control layer 204 is removed. In this case, the switching device 200 is suitable to be used as a switch. When the switching device 200 is suitable to be used as a memory cell, the configuration of the cantilever 205 (e.g. configuration 231 and configuration 230) may define '0' or '1' that can be subsequently read. The memory cell may be reprogrammed by reversing the voltages initially applied on the control layer 204 and the further control layer 209, i.e. by keeping the control layer 204 and the cantilever 205 at the same potential and applying a voltage difference between the cantilever 205 and the further control layer 209.

Similarly, configuration 232 is achievable by applying a voltage difference between the further control layer 209 and the contact region 202. At the same time, the contact region 202 and the control layer 204 may be kept at a same voltage. When the voltage difference between the cantilever 205 and the further control layer 209 is no longer applied, the cantilever 205 may remain to be in the configuration 232 by means of forces such as van der Waals and Casimir effect. In this case, the switching device 200 is suitable to be used as a memory.

By manipulating the voltages applied to the contact region 202, the control layer 204 and the further control layer 209, the cantilever 205 is movable among the configurations 230, 231, and 232.

FIGS. 3(a) to (f) show that the switching device 200 may be fabricated with a top-down CMOS-compatible fabrication process according to an exemplary embodiment. By applying such a process, a significantly smaller area footprint for high integration density and low cost fabrication may be achieved.

Figure 4:
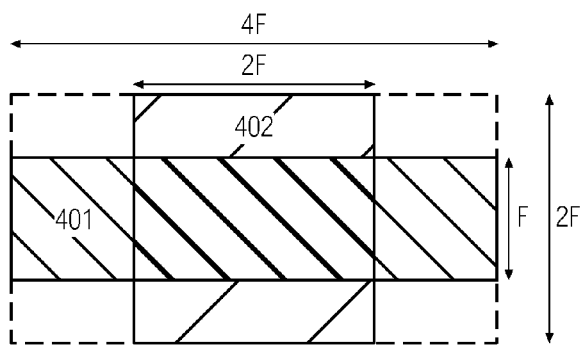
FIG. 4 shows the layout of the masks used in the fabrication process shown in FIGS. 3(a) to (f)

Through the fabrication process shown in FIGS. 3(a) to (f), two photolithography steps may be utilized to realize a self-aligned structure. FIG. 4 shows the two-mask layout for the fabrication of the switching device 200. In FIG. 4, mask 401 may be used to define the nanofin 301 (see FIG. 3(a)), and mask 402 may be used to define the nitride strip 302 around the nanowall (see FIG. 3(b)). 'F' in FIG. 4 denotes the feature size.

FIG. 3(a) shows a silicon nanofin (or nanowall) 301 formed over a substrate 310. The process for fabricating vertical silicon nanowires for gate-all-around MOSFETS may be used to obtain high aspect ratio silicon nanowalls. Photoresist strips of 160-200 nm width are patterned (Mask 401 as shown in FIG. 4) on 8-inch bulk silicon wafers (p-type) and trimmed to 90-130 nm. The nanofin is formed by silicon deep reactive-ion etching (DRIE) 500 nm and thinned by thermal oxidation and stripping the oxide in dilute hydrofluoric acid (DHF) to obtain thicknesses of 20-50 nm. A person skilled in the art would appreciate that the dimensions described herein are only for illustrative purpose, and, should not be limited thereto. Other dimensions may be chosen to achieve a similar device.

FIG. 3(b) shows that silicon nitride is deposited over the silicon nanofin 301 and lithographically patterned. Silicon nitride (50 nm) is deposited over the silicon nanofin 301 by low-pressure chemical vapor deposition (LPCVD) and patterned (Mask 402 as shown in FIG. 4) in strips 302 running perpendicularly to the silicon nanofins 301. These strips 302 may be used to protect sections of the silicon nanofin 301 from the subsequent local oxidation of silicon (LOCOS). In other words, at least a part of the silicon nanofin covered by the silicon nitride 302 will be protected from later LOCOS process and will form the silicon cantilever. The silicon nanofin not covered by the silicon nitride is to undergo a LOCOS process and the resulted oxide is to be etched away to make the silicon cantilever to be freestanding over the substrate 310. These protected sections may form the vertical silicon cantilever switch element, while the oxidized sections are to be etched away, so as to separate the individual cantilever switch elements. To pattern the nitride strips 302 conformally around the nanofins 301, an intermediate mask of tetraethyl orthosilicate (TEOS) oxide (20 nm) may be used. The photoresist pattern (Mask 402 as shown in FIG. 4) may be first transferred to the oxide mask by DHF wet etching. The photoresist may be stripped off and the pattern is transferred from the oxide to the nitride by etching in hot phosphoric acid. The remaining oxide is stripped off in DHF, leaving the desired nitride strips 302.

FIG. 3(c) shows that the LOCOS (80 nm oxide) is applied, and thereafter the nitride strips 302 is stripped off, leaving a nanofin with alternating sections of silicon 303 and thermal oxide 304. The electrical connections are defined by n-type shallow implantation (As/6 eV/4×10$^{15}$ cm$^{-2}$/15° tilt from 2 directions) using the thermal oxide as a self-aligned mask. The p-n junction formed by the doping allows for electrical access to the cantilever, separate from the substrate.

FIG. 3(d) shows a thin layer of LPCVD TEOS oxide (40 nm) is deposited over the structure shown in FIG. 3(c) in order to define the cantilever switch gap, e.g. gap between the cantilever 205 and the vertical layer arrangement 203, and gap between the cantilever 205 and the further vertical layer arrangement 208 shown in FIGS. 2(a) and (b).

FIG. 3(e) shows that polysilicon electrodes 306 are deposited. Polysilicon (500 nm) is deposited by LPCVD to form the fixed electrodes (e.g. control layers 204 and 209 in FIGS. 2(a) and (b)) on either side of the cantilever 305. Thereafter, using chemical-mechanical planarization (CMP), the wafer is planarized to expose the oxide over the nanofin and silicon cantilever 305.

FIG. 3(f) shows that oxide of the nanofin is further released, thereby leaving the silicon cantilever 305 to be freestanding.

The polysilicon is implanted (Phosphorus/90 keV/4×10$^{15}$ cm$^{-2}$/0° tilt), and the oxide is etched away with HF vapor, thereby releasing the vertical silicon cantilevers (e.g. cantilever 205 as shown in FIGS. 2(a) and (b)).

The method of fabricating vertical silicon NEM switches as shown in FIGS. 3(a) to (f) utilizes only two photolithography steps to realize a self-aligned structure, complete with electrical connections. Additionally, the top-down CMOS-compatible fabrication of the device makes it suitable for mass manufacturing at low cost, and reaps substantial benefits in size and switching speed with scaling.

Figure 5:
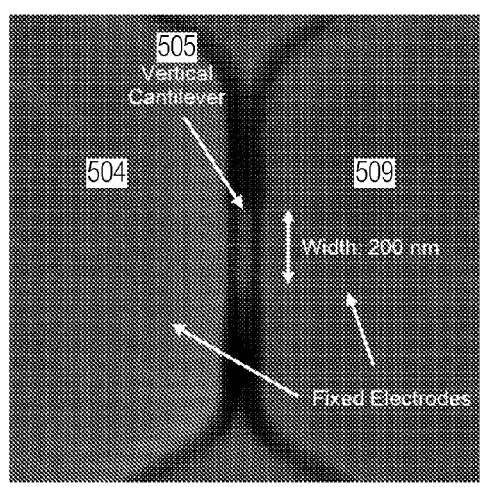
FIG. 5(a) shows the top view SEM image of a switching device fabricated according to the process shown in FIGS. 3(a) to (f)
FIG. 5(b) shows the cross section SEM image of the switching device shown in FIG. 5(a)
Figure 5:
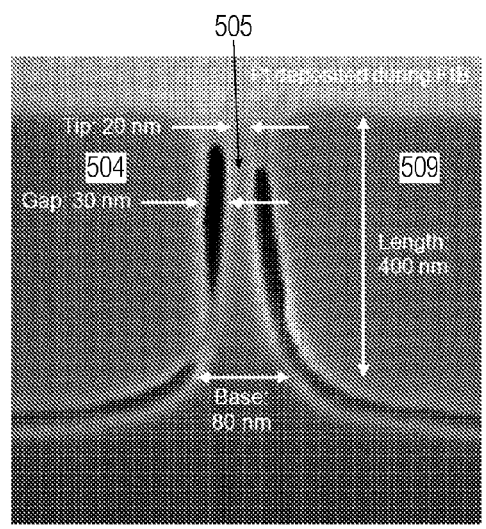

FIG. 5(a) shows the top view of a resulting vertical cantilever 505 between the fixed two electrodes 504 and 509 under the scanning electron microscope (SEM) manufactured by the process shown in FIGS. 3(a) to (f). Focused ion beam (FIB) can be used to make a cut through the center of the cantilever and the resulting cross-section is shown in FIG. 5(b). The cantilever 505 has a length of 400 nm with a thickness of 20 nm at the tip and tapers out toward the base due to thermal oxidation.

Figure 6:
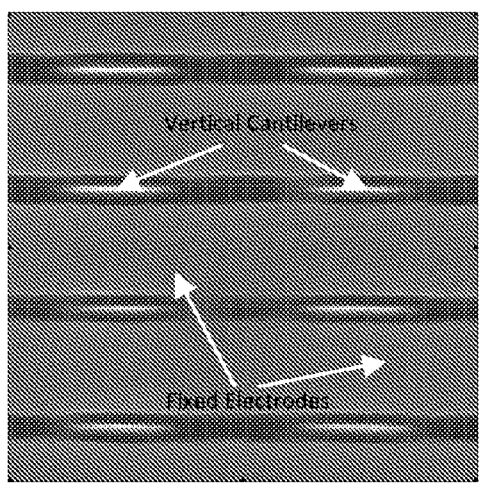
FIG. 6(a) shows the top view of an array of switching devices fabricated following the process shown in FIGS. 3(a) to (f)
FIG. 6(b) shows the layout of the masks used in the fabrication of the array of switching devices shown in FIG. 6(a)
Figure 6:
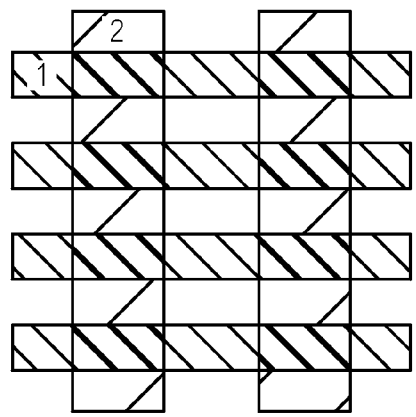

FIG. 6(a) shows an SEM image of the top view of a 4×2 array of switching devices (NEM switches) fabricated using the process shown in FIGS. 3(a) to (f) by using a mask layout as illustrated in FIG. 6(b) for a cell size of 8F$^2$ (F: feature size, 0.16 μm). FIG. 6(b) shows the two-mask layout of the array of vertical NEM switches. This structure can be used for memory applications.

For an array, the minimum cell size of 8F$^2$ as illustrated in FIG. 4 is limited by the lithographic depth of focus that restricts the conformal patterning of the second mask 402 over the nanowalls. Smaller cell sizes is possible with additional masks or process steps.

Figure 7:
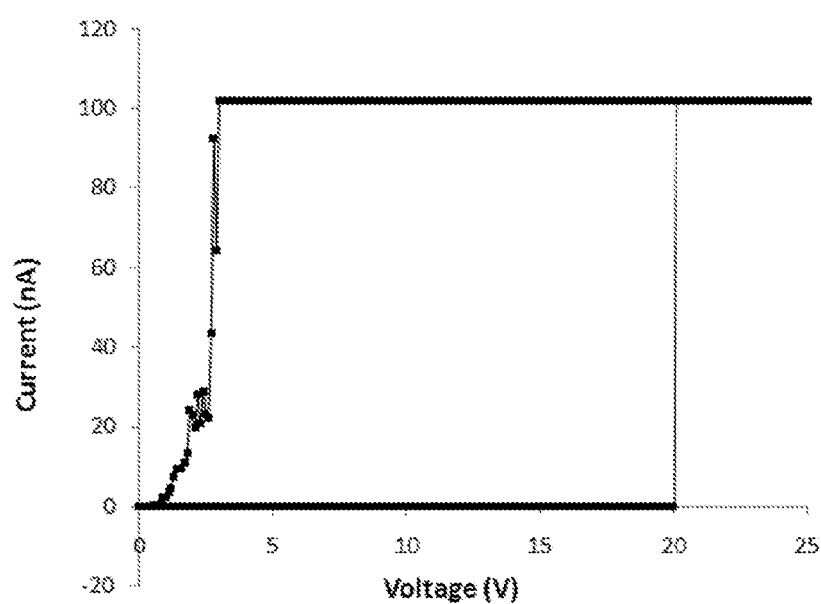
FIG. 7 shows the relationship between the voltage applied at both the cantilever and the right fixed electrode and the current between the cantilever and the left fixed electrode of the switching device shown in FIG. 5(a) in linear scale.
Figure 8:
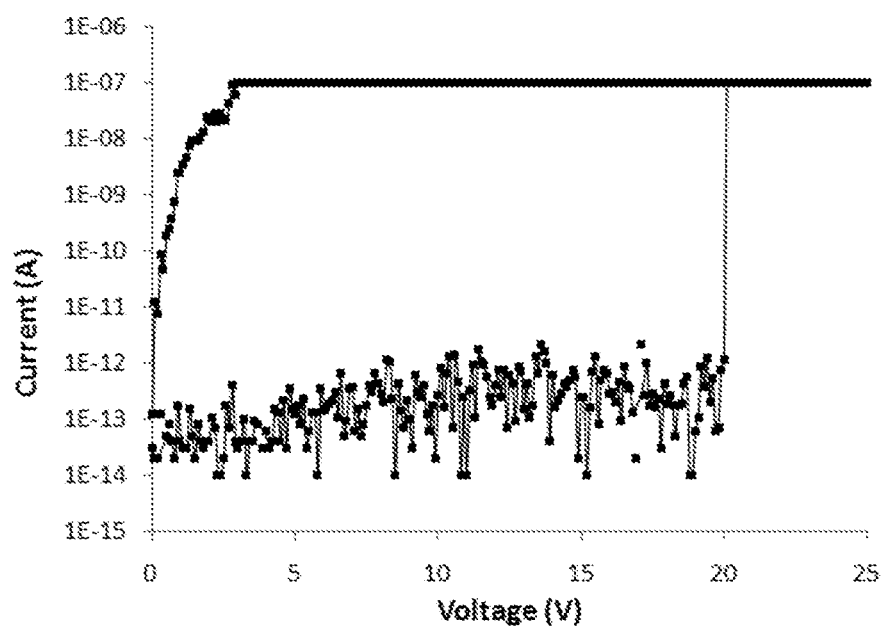
FIG. 8 shows the same result as shown in FIG. 7 in log scale.

The vertical switch as shown in FIGS. 5(a) and (b) was tested by applying a voltage sweep to both the cantilever 505 and the right fixed electrode 509 while maintaining the left fixed electrode 504 and substrate at ground. FIG. 7 shows the measured current between the cantilever 505 and a polysilicon electrode 504 in linear scale as a function of the applied voltage difference for a vertical cantilever 505 with dimensions shown in FIGS. 5(a) and (b). FIG. 8 shows the same measured current as in FIG. 7 in log scale. In FIG. 7 and FIG. 8, the measured current between the cantilever 505 and the left fixed electrode 504 shows a sharp, almost infinite jump of over 5 decades at a pull-in voltage of 20V.

The fabrication of a vertical NEM silicon switch with CMOS-compatible techniques as described herein is achieved with a simple and low cost process requiring just two lithography masks. Orienting the cantilever vertically increases the device density significantly and can offer NEM switches competitive densities compared to current and emerging technologies.

FIG. 9(a) shows the cross section view of a switching device 900 according to one exemplary embodiment.

The switching device 900 includes a substrate 901 which has a contact region 902. The switching device 900 further includes a vertical layer arrangement 903 extending from the substrate 901 next to the contact region 902. The switching device 900 further includes a freestanding silicon cantilever 905 extending vertically from the contact region 902.

The vertical layer arrangement 903 includes a control layer 904 and a contact layer 910. As can be seen, the device 900 differs from the device 200 shown in FIG. 2(a) in that, each vertical layer arrangement (e.g. the vertical layer arrangement 903) of the device 900 has separate control layer and contact layer, while for each vertical layer arrangement (e.g. the vertical layer arrangement 203) of device 200, the control layer and the contact layer is the same. The cantilever 905 extends vertically next to the control layer 904 and the contact layer 910 of the vertical layer arrangement 903.

In this exemplary embodiment, the substrate 901 is silicon. The cantilever 905 is electrically connected and mechanically fixed to the contact region 902.

The switching device 900 further includes a further vertical layer arrangement 908 formed on the substrate 901 next to the contact region 902 opposite the vertical layer arrangement 903. The further vertical layer arrangement 908 includes a further contact layer 911 and a further control layer 909 such that the cantilever 905 extends between the vertical layer arrangement 903 and the further vertical layer arrangement 908.

The contact layer 910 and the control layer 904 are isolated by an isolating layer 912. The further contact layer 911 and the further control layer 909 are isolated by an isolating layer 913. The control layer 904 and the substrate 901 are isolated by an isolating layer 914. The further control layer 909 and the substrate 901 are isolated by an isolating layer 915. Each of the isolating layers may be a oxide material, e.g. silicon oxide.

Each of the control layer 904 and the further control layer 909 may be referred to as a gate or a bottom electrode. Each of the contact layer 910 and the further contact layer 911 may be referred to as a drain or a top electrode. Each of the control layer 904 and the further control layer 909 may include poly/amorpous-silicon, or a metal, or a combination of metal and poly/amorphous-silicon. For a more detailed example, the control layer 904 may include two layers wherein one layer is metal and one layer is polysilicon or amorphous silicon. Each of the contact layer 910 and the further contact layer 911 may include poly/amorpous-silicon, or a metal, or a combination of metal and poly/amorphous-silicon. The control layer 904 and the contact layer 910 may be made of different material, e.g. the control layer 904 may include polysilicon and the contact layer 910 may include a metal.

The control layer 904 is mounted between the substrate 901 and the contact layer 910. The further control layer 909 is mounted between the substrate 901 and the further contact layer 911.

The cantilever 905 is adapted such that it can be brought into contact electrostatically with the contact layer 910 by applying a voltage difference between the contact region 902 and the control layer 904. The cantilever 905 is also adapted such that it can be brought into contact electrostatically with the further contact layer 911 by applying a voltage different between the contact region 902 and the further control layer 909.

When the cantilever 905 extends at least substantially vertical to the substrates 901, the contact layer 910 is closer to the cantilever 905 compared with the control layer 904, and the further contact layer 911 is closer to the cantilever 905 compared with the further control layer 909. This may allow that, when a voltage difference is applied between the control layer 904 (or further control layer 909) and the contact region 902, the cantilever 905 is brought into contact with the contact layer 910 (or the further contact layer 911) without contacting the control layer 904 (or the further control layer 909). This can also be seen from FIGS. 9(b) and (c).

FIG. 9(b) shows that the substrate 901, the control layer 904, the contact layer 910, and the further contact layer 911 are fixed at ground, and a voltage is applied to the further control layer 909. The voltage difference between the substrate 901 (and thus the contact region 902 and the cantilever 905) and the further control layer 909 causes the cantilever 905 to be brought into contact with the further contact layer 911 electrostatically. As the further contact layer 911 and the substrate 901 are maintained at the same potential, there is no current flow or discharge upon contact, and thus there is a reduced risk of cantilever melting or deforming upon contact.

FIG. 9(c) shows that with respect to FIG. 9(b), the voltage to the further control layer 909 is no longer applied and the further control layer 909 is fixed at ground. The cantilever 905 remains in contact with the further contact layer 911 by means of at least one of van der Waals force, Casimir effect and other forces.

In FIGS. 9(a) to (c), the cantilever 905 may also be referred to as a source. Each of the control layer 904 and the further control layer 909 may be referred to as a gate. Each of the contact layer 910 and the further contact layer 911 may be referred to as a drain.

In the embodiment shown in FIGS. 9(a) to (c), both source and drain can be maintained at a same potential. There is no current flow or discharge upon contact of the drain with the source, and thus there is a reduced risk of cantilever melting or deforming upon contact. During the switching, there is no contact between the cantilever and the gate. Van der Waals forces can be controlled to be strong enough to maintain contact on removal of applied gate voltage by manipulating device dimensions. The switching device 900 may function as a memory device or a switch depending on the strength of the van der Waals forces. That is, if the van der Waals forces are strong enough to maintain contact of the source and drain when the gate voltage (i.e. the voltage difference between the gate and the source) is no longer applied, the switching device 900 may be used as a memory; while if the van der Waals forces are not strong enough to maintain contact of the source and drain when the gate voltage (i.e. the voltage difference between the gate and the source) is no longer applied, the switching device 900 may be used as a switch.

FIG. 10(a) shows a switching device 1000 according to one exemplary embodiment.

The switching device 1000 has a similar structure as the switching device 900, and like reference numerals are used to denote like features. The switching device 1000 differs from the switching device 900 in that the switching device 1000 includes a vertical layer arrangement 903 which has a contact layer 1010 and a control layer 1004. The contact layer 1010 of the vertical arrangement 903 is located between the control layer 1004 and the substrate 901. The switching device 1000 further includes a further vertical layer arrangement 908 which has a further contact layer 1011 and a further control layer 1009, and the further contact layer 1011 is located between the further control layer 1009 and the substrate 901. When the cantilever 905 extends at least substantially vertically from the substrate 905, the contact layer 1010 is closer to the cantilever 905 compared with the control layer 1004, and the further contact layer 1011 is closer to the cantilever 905 compared with the further control layer 1009.

The cantilever 905 may be referred to as a source. Each of the control layer 1004 and the further control layer 1009 may be referred to as a gate or top electrode. Each of the contact layer 1010 and the further contact layer 1011 may be referred to as a drain or a bottom electrode.

The contact layer 1010 and the control layer 1004 are isolated by an isolating layer 912. The further contact layer 1011 and the further control layer 1009 are isolated by an isolating layer 913. The control layer 1004 and the substrate 901 are isolated by an isolating layer 914. The further control layer 1009 and the substrate 901 are isolated by an isolating layer 915. Each of the isolating layers may be an oxide layer, e.g. silicon oxide.

Each of the control layer 1004 and the further control layer 1009 may be poly/amorphous-silicon, or a metal, or a combination of metal and poly/amorphous-silicon. Each of the contact layer 1010 and the further contact layer 1011 may be poly/amorphous-silicon, or a metal, or a combination of metal and poly/amorphous-silicon.

The cantilever 905 is adapted such that it can be brought into contact electrostatically with the contact layer 1010 by applying a voltage difference between the contact region 902 and the control layer 1004. The cantilever 905 is also adapted such that it can be brought into contact electrostatically with the further contact layer 1011 by applying a voltage difference between the contact region 902 and the further control layer 1009.

Figure 10:
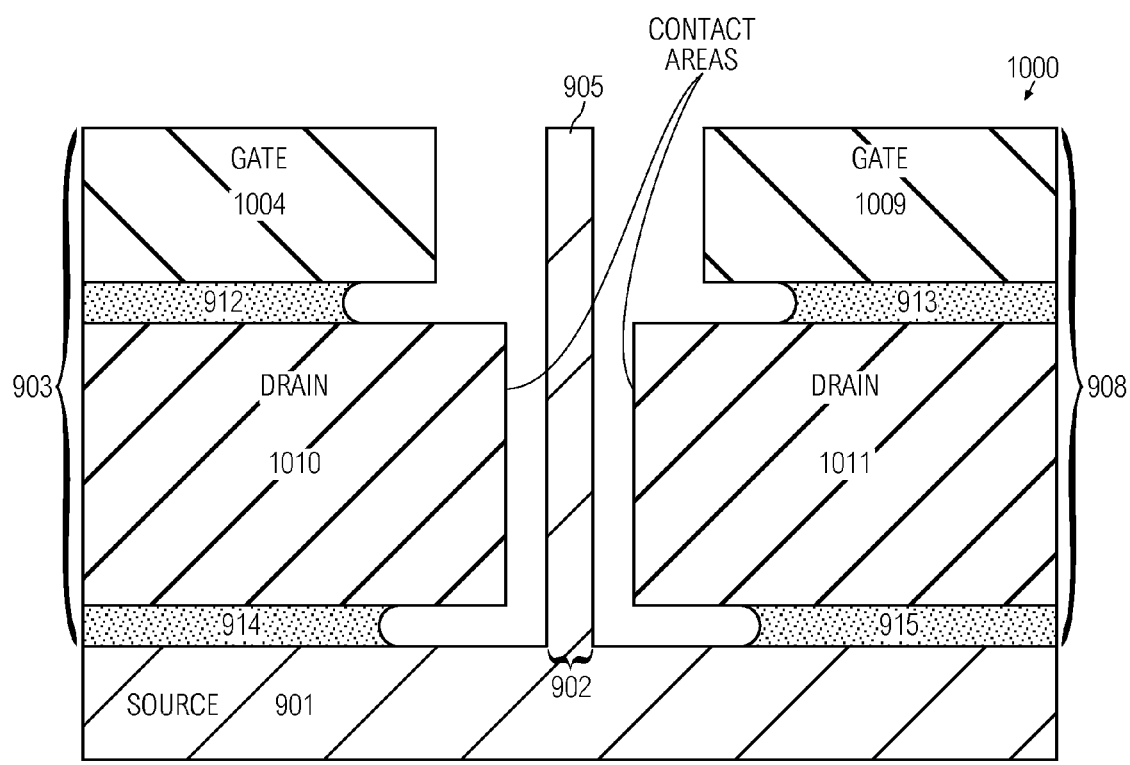
FIG. 10(a) shows the cross section view of a switching device according to one exemplary embodiment.
FIG. 10(b) shows that when a voltage difference is applied between the substrate and the right control layer of the switching device as shown in FIG. 10(a), the cantilever is brought into contact with the right contact layer.
Figure 10:
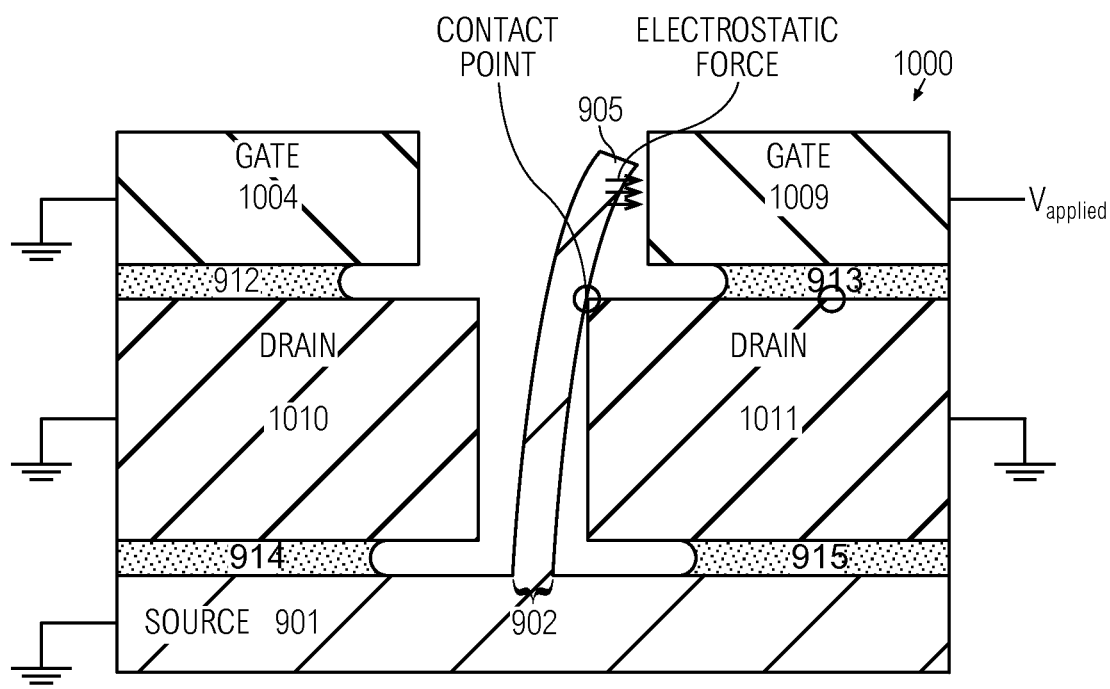

FIG. 10(*b*) shows that the substrate 901, the control layer 1004, the contact layer 1010, and the further contact layer 1011 are fixed at ground, and a voltage is applied to the further control layer 1009. The cantilever 905 is brought into contact with the further contact layer 1011 electrostatically. During the switching, base of the cantilever 905 bends away from the further contact layer (drain electrode) 1011. There is point contact between the cantilever 905 and the further contact layer (drain) 1011. There is no contact between the cantilever 905 and the further control layer (gate) 1009. When both source and drain are maintained at a same potential, there is no current flow or discharge upon contact, and thus there is a reduced risk of cantilever melting or deforming upon contact.

When there is only point contact, van der Waals forces are generally not sufficient to keep the cantilever 905 to be in contact with the drain 1011 when the gate voltage at the further control layer 1009 is no longer applied. Thus, the switching device 1000 is more suitable for use as a switch than for a memory device.

Figure 9:
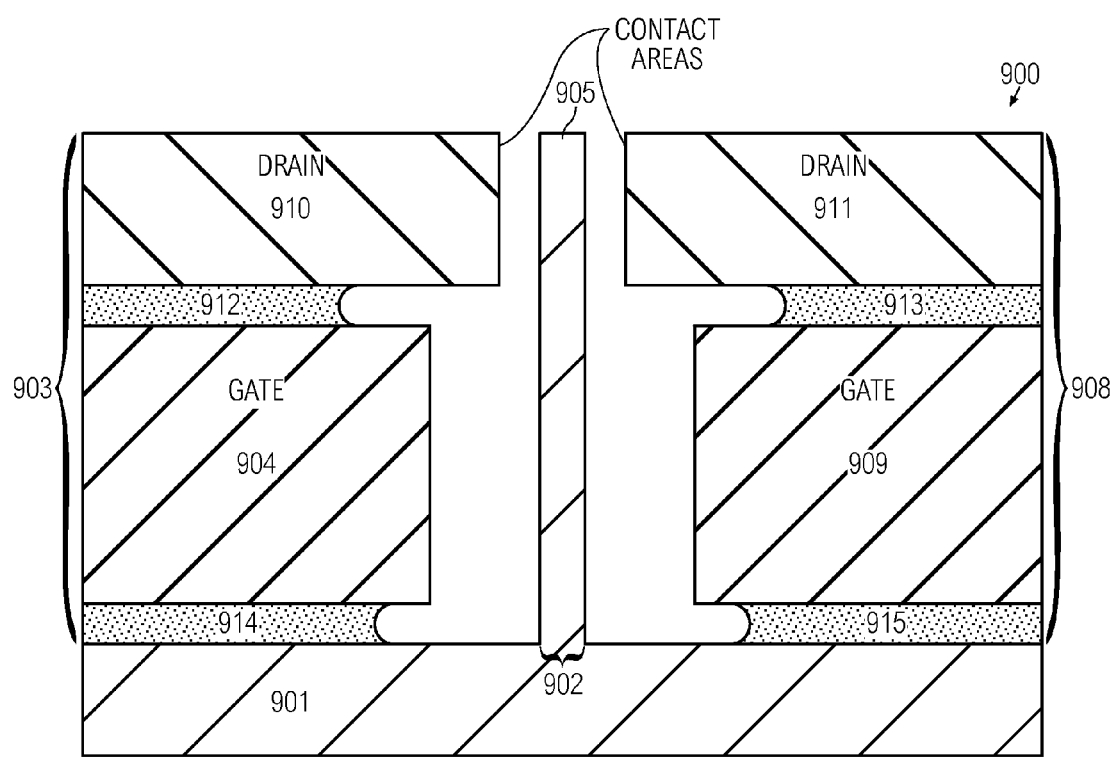
FIG. 9(a) shows the cross section view of a switching device according to one exemplary embodiment.
FIG. 9(b) shows the cantilever of the switching device as shown in FIG. 9(a) is brought into contact with a contact layer on the right side of the cantilever when a voltage difference is applied between the substrate and the control layer on the right side of the cantilever.
FIG. 9(c) shows that when the voltage difference shown in FIG. 9(b) is no long applied, the cantilever remains to be in contact with the contact layer.
Figure 9:
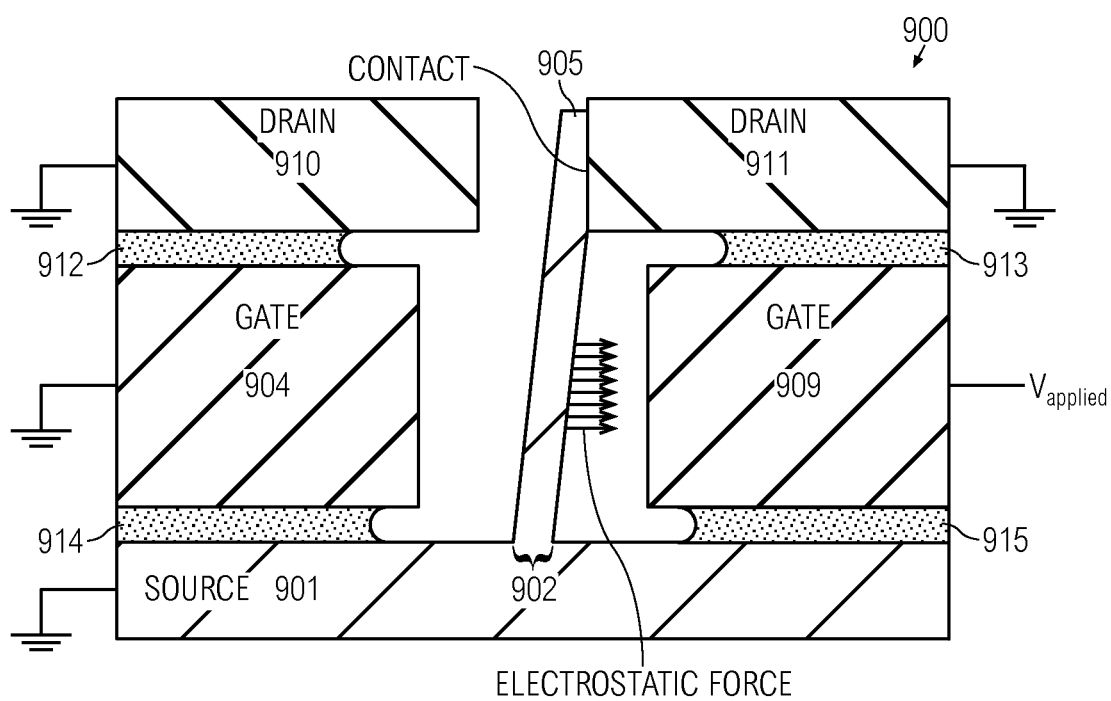
Figure 9:
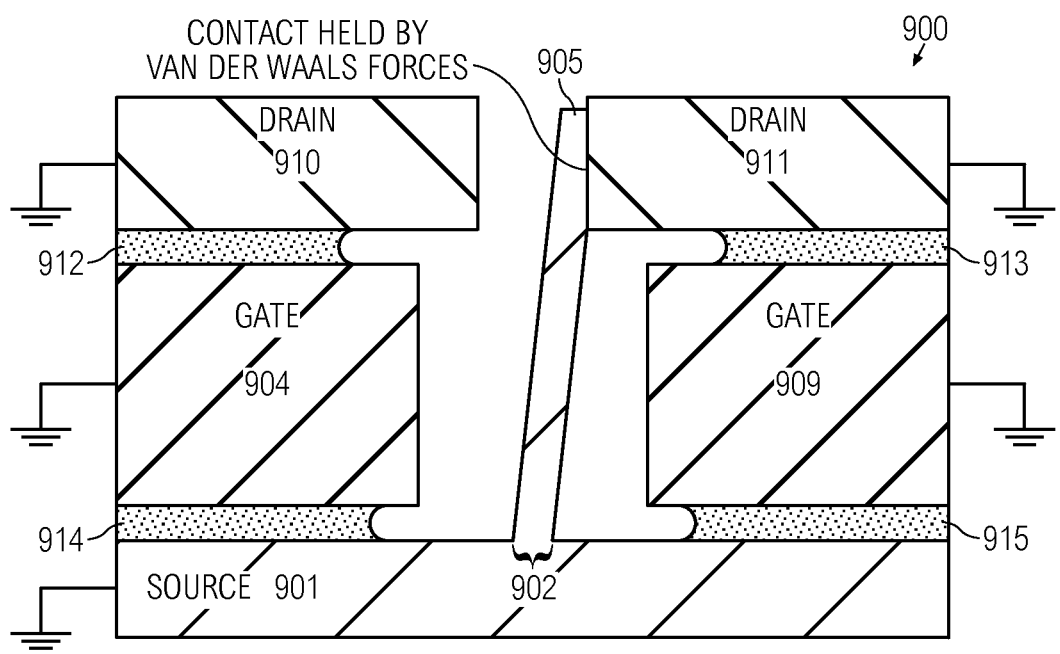
Figure 11:
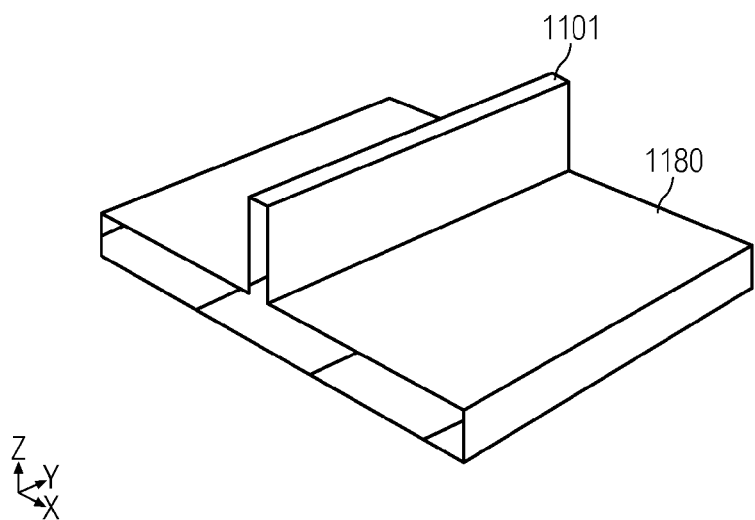
Figure 11:
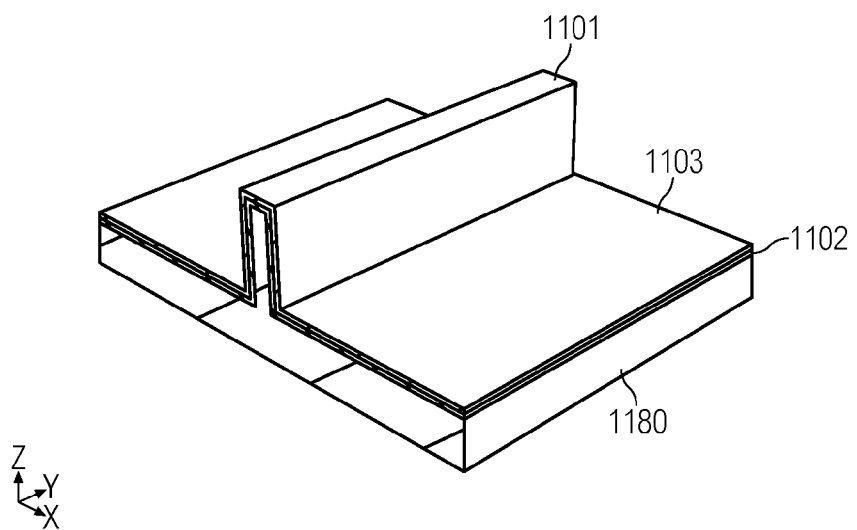
Figure 11:
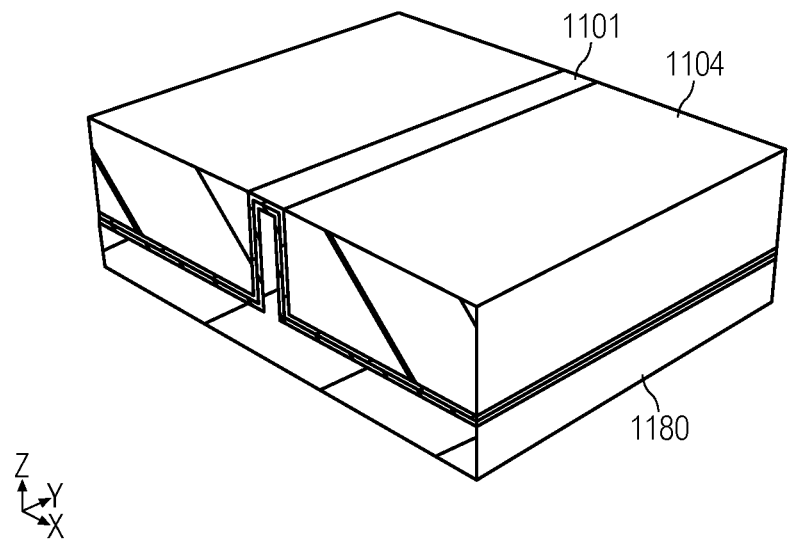
Figure 11:
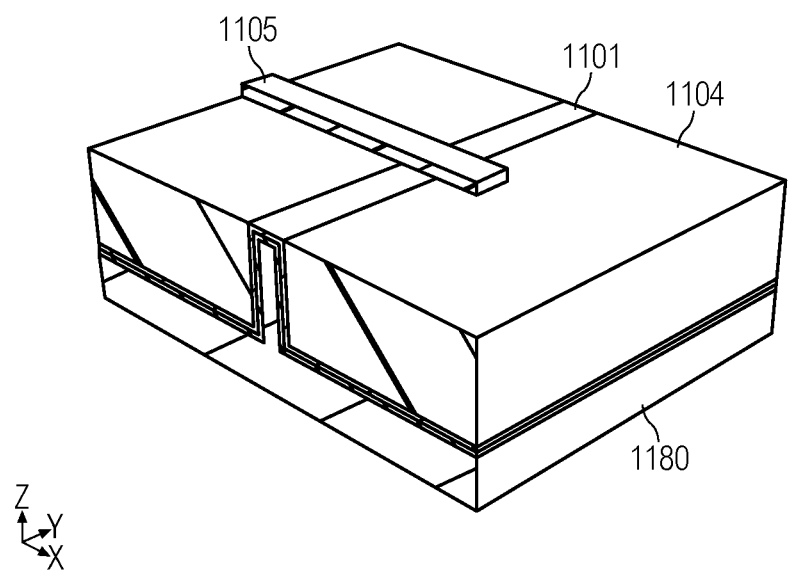
Figure 11:
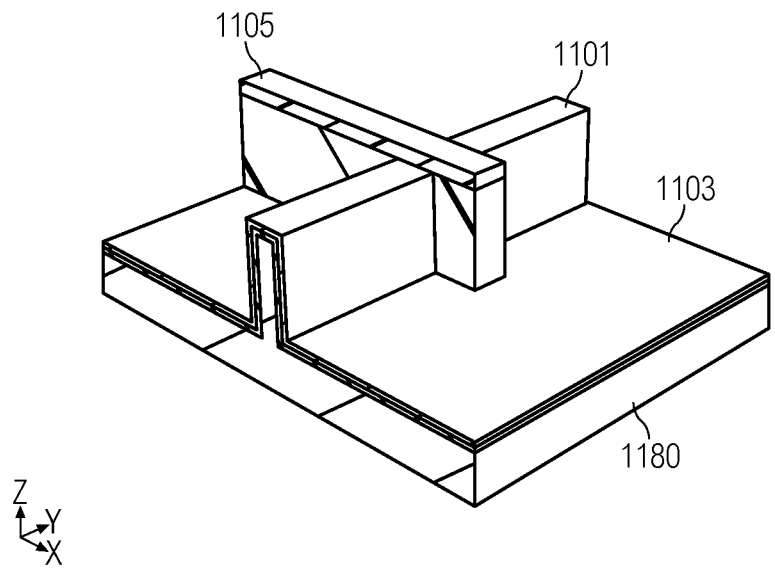
Figure 11:
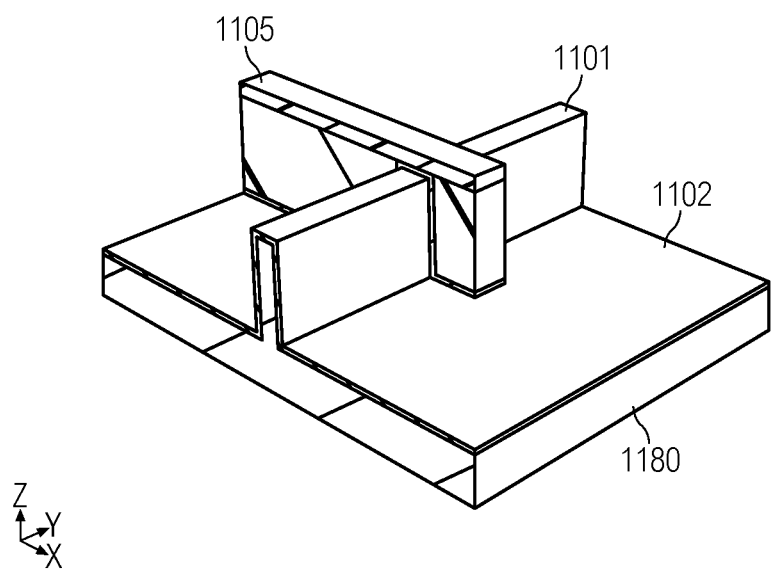
Figure 11:
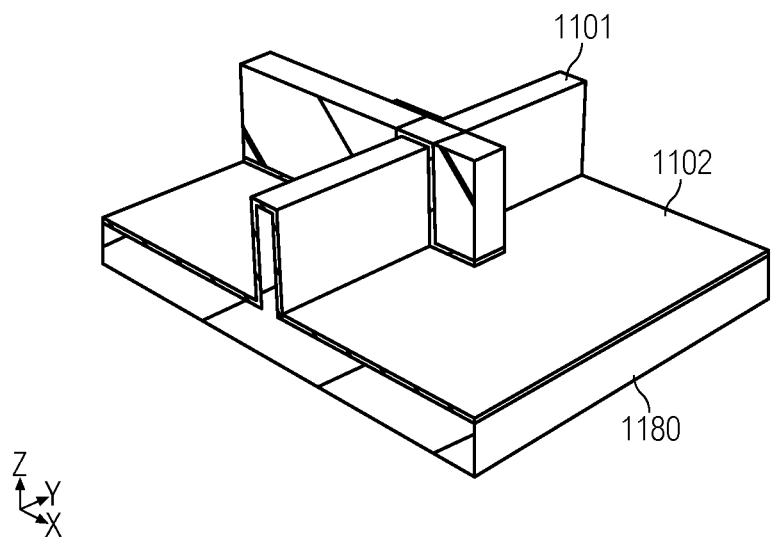
Figure 11:
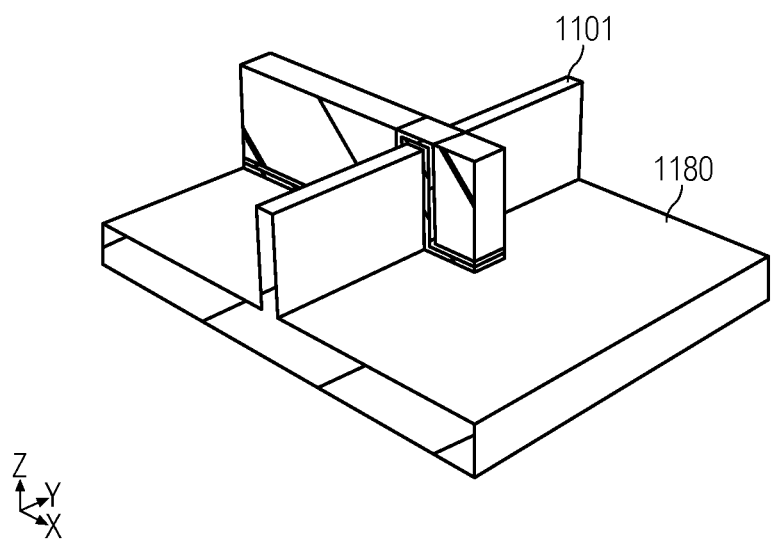
Figure 11:
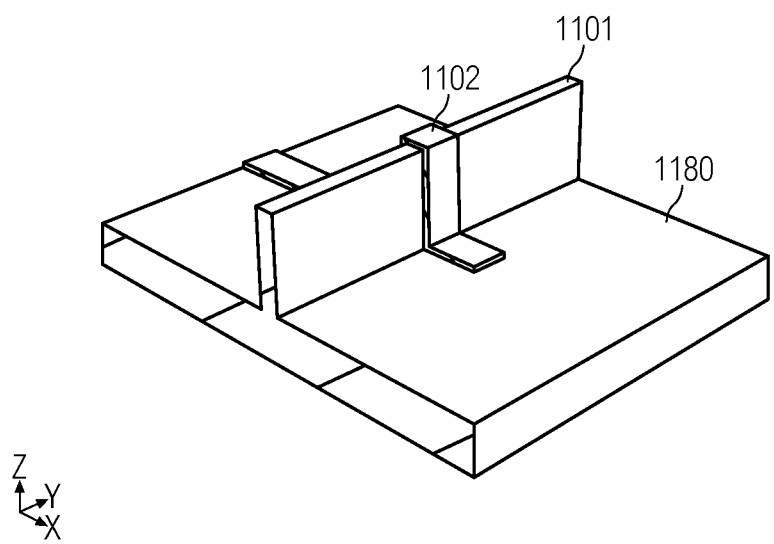
Figure 11:
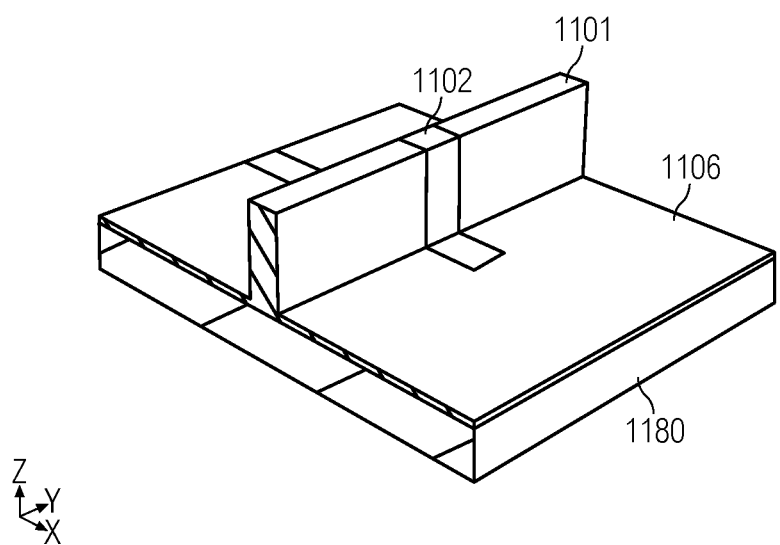
Figure 11:
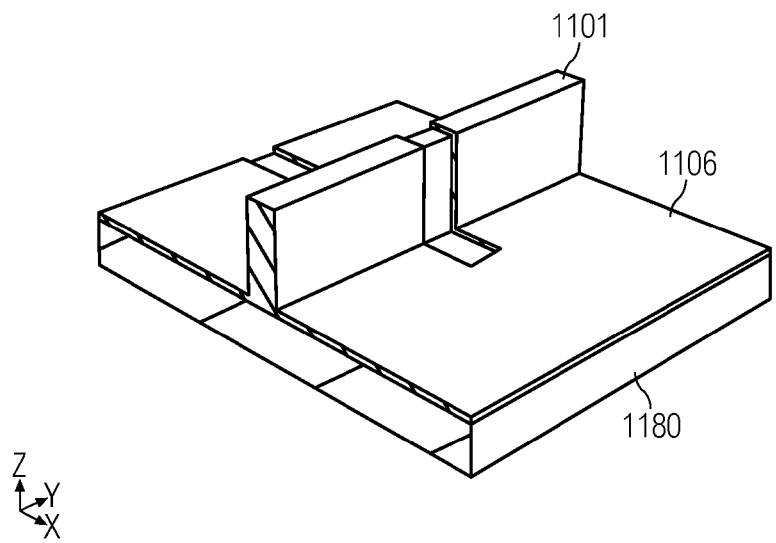
Figure 11:
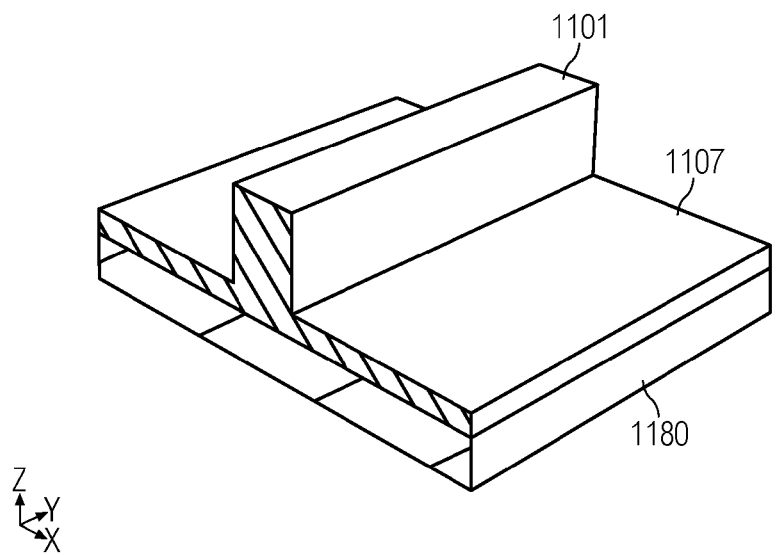
Figure 11:
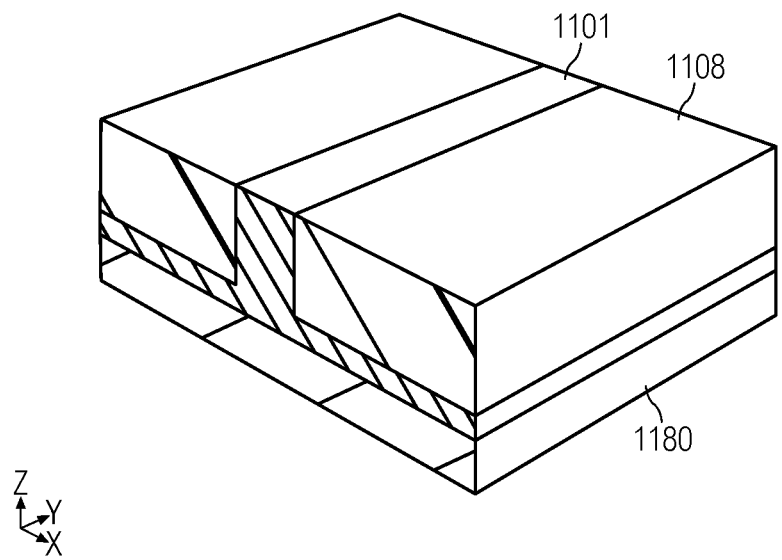
Figure 11:
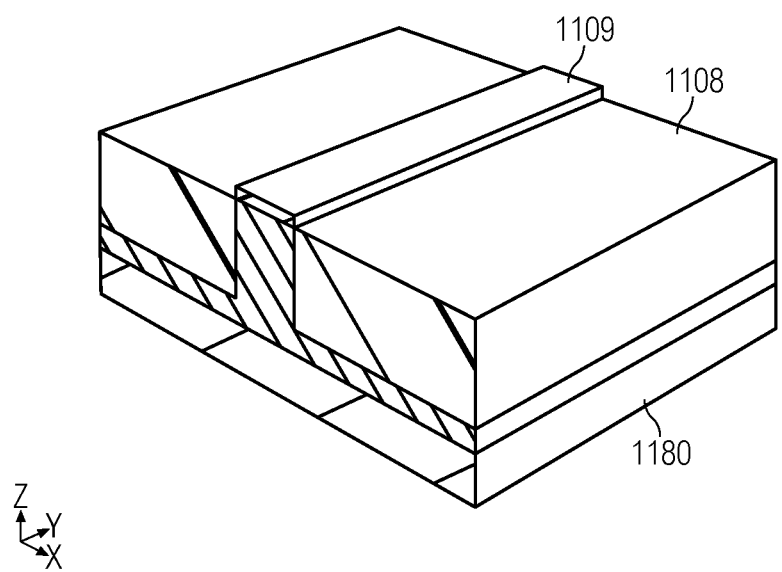
Figure 11:
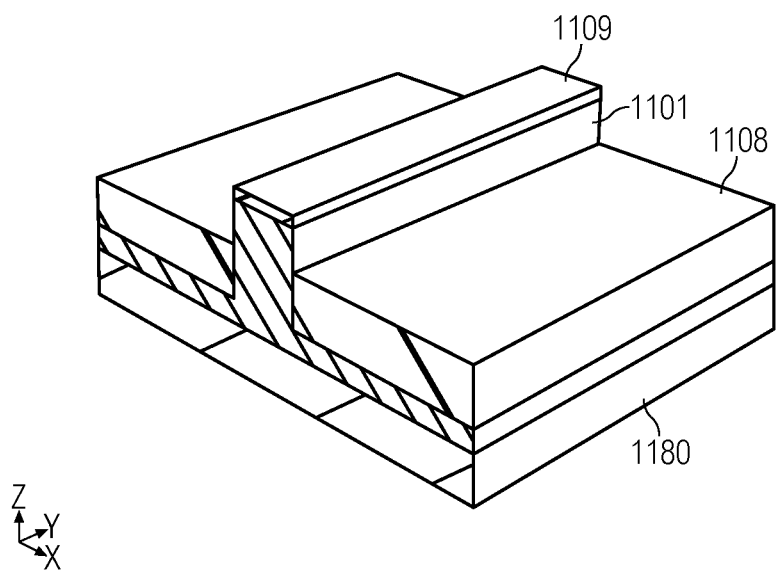
Figure 11:
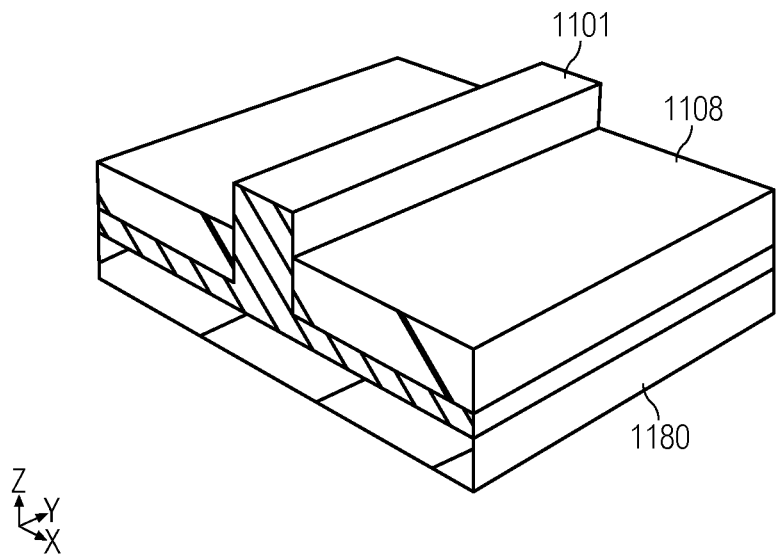
Figure 11:
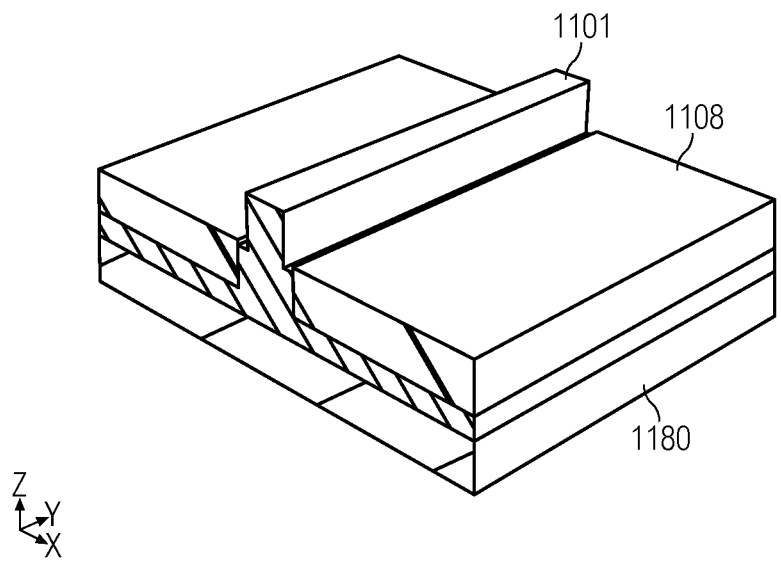
Figure 11:
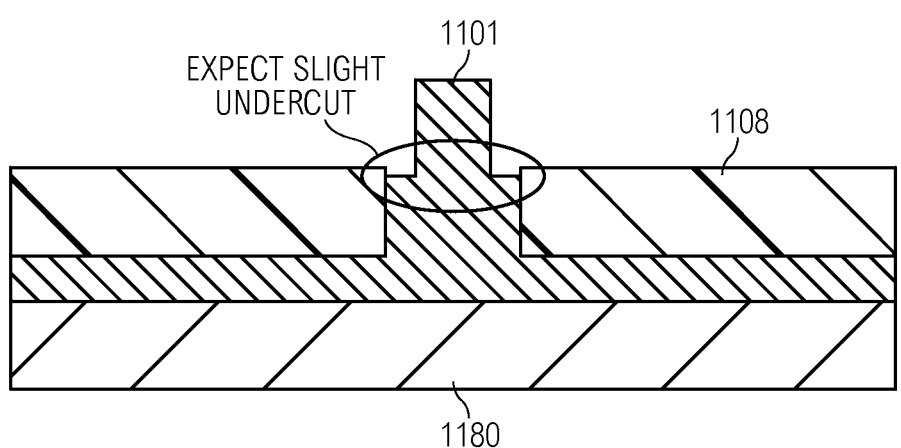
Figure 11:
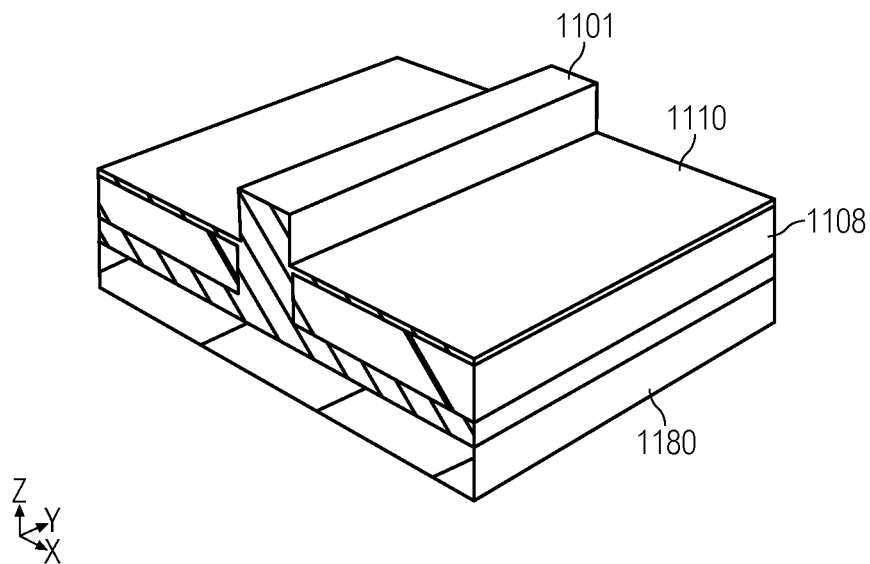
Figure 11:
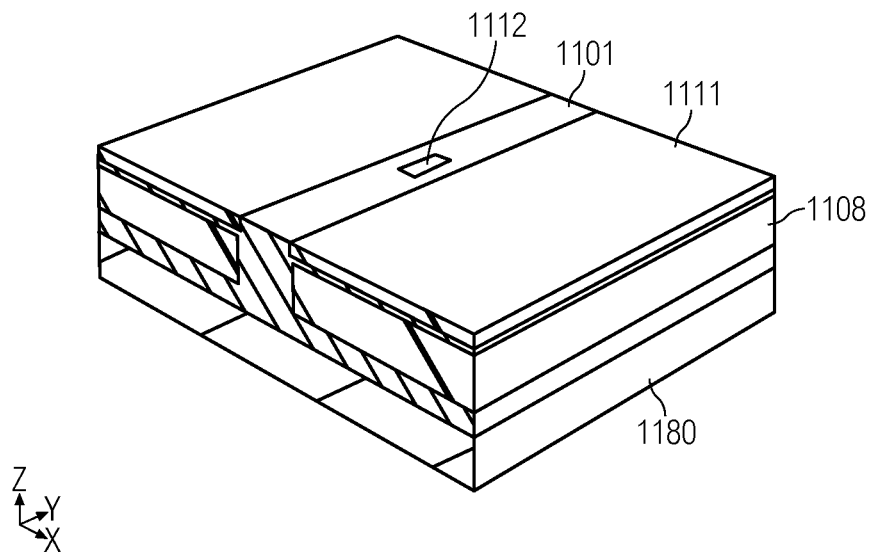
Figure 11:
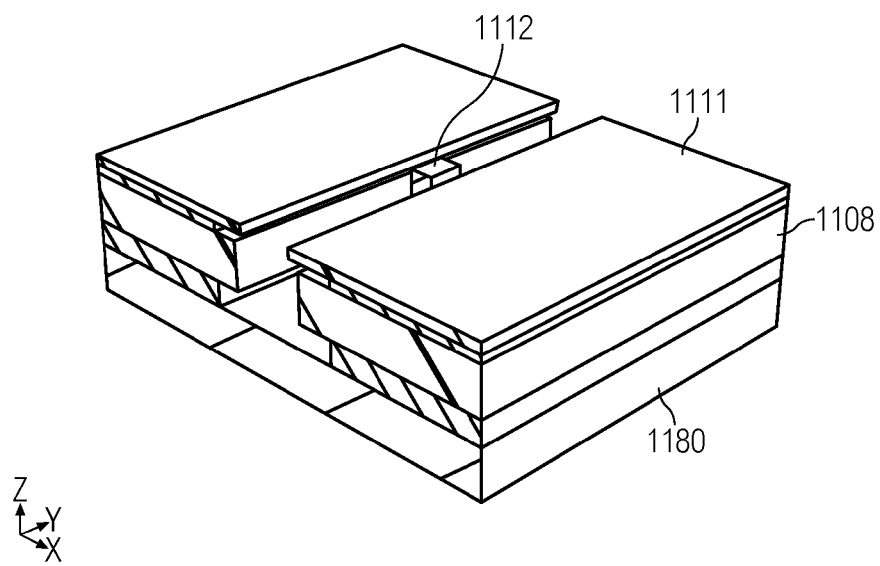
Figure 11:
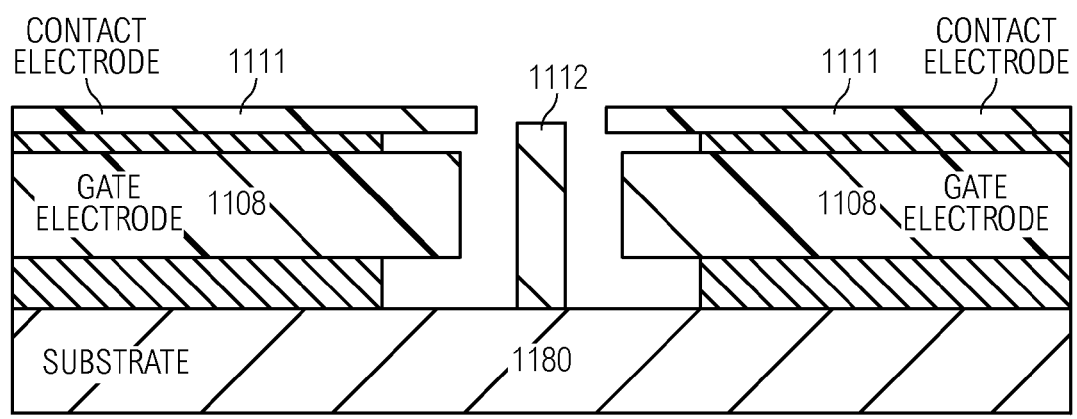

FIGS. 11(*a*) to (*v*) shows the fabrication process of the switching device 900 as shown in FIGS. 9(*a*) to (*c*) according to an exemplary embodiment.

FIG. 11(*a*) shows that a silicon nanofin 1101 is firstly formed over a substrate 1180. The nanofin 1101 may be a nanowall. The method of forming the nanowall 301 as explained with reference to FIG. 3(*a*) may be used.

FIG. 11(*b*) shows that silicon nitride 1102 is deposited over the structure as shown in FIG. 11(*a*), and thereafter TEOS oxide 1103 is further deposited over the layer of silicon nitride 1102.

FIG. 11(*c*) shows that polysilicon 1104 is further deposited over the structure shown in FIG. 11(*b*), e.g. by LPCVD. CMP may be further used to planarize the top surface of the structure to expose the oxide over the nanofin 1101. This step is performed to overcome the lithographic depth-of-focus limit to achieve taller nanofins.

FIG. 11(*d*) shows that a lithography mask 1105 which defines a pattern region is disposed over the structure as shown in FIG. 11(*c*). The polysilicon covered by the mask 1105 is protected from being etched away in the later process. In particular, a freestanding silicon cantilever will be formed from a part of the nanofin 1101 that is covered by the mask 1105.

FIG. 11(*e*) shows that polysilicon that is not covered by the lithography mask 1105 is etched away by DRIE. The etching stops on oxide 1103.

FIG. 11(*f*) shows that the oxide 1103 that is not covered by the mask 1105 is further etched away.

FIG. 11(*g*) shows that the mask 1105 is stripped off.

FIG. 11(*h*) shows that the silicon nitride 1102 outside the pattern region is etched away.

FIG. 11(*i*) shows that polysilicon 1104 within the pattern region is removed, and further oxide 1103 within the pattern region is stripped off.

FIG. 11(*j*) shows thermal oxidation is carried out for the structure shown in FIG. 11(*i*), thereby forming a layer of oxide 1106 outside the pattern region.

FIG. 11(*k*) shows that the nitride strip 1102 within the pattern region is stripped off, and the exposed silicon is doped by implantation. Electrical connection to the exposed silicon nanowall is also defined.

FIG. 11(*l*) shows that TEOS oxide 1107 is deposited over the structure shown in FIG. 11(*k*). The gap between the cantilever and the bottom electrode is defined by the thickness of the TEOS deposited.

FIG. 11(*m*) shows that polysilicon 1108 is deposited over the structure shown in FIG. 11(*l*), and thereafter CMP may be used to planarize the top surface of the structure to expose the oxide over the nanofin 1101.

FIG. 11(*n*) shows that a lithography mask 1109 is disposed over the oxide over the nanofin 1101.

FIG. 11(*o*) shows part of the polysilicon 1108 is etched away by DRIE.

FIG. 11(*p*) shows the PR mask 1109 is stripped off, and implantation is carried out.

FIG. 11(*q*) shows that the oxide over the nanowall 1101 is partially etched in a controlled manner by HF vapour. This allows definition of top electrode that is closer to the cantilever compared with bottom electrode.

FIG. 11(*r*) shows the cross section view of the structure shown in FIG. 11(*q*).

FIG. 11(*s*) shows oxide 1110 is deposited over the structure shown in FIG. 11(*r*), so as to isolate top (e.g. contact layer) and bottom (control layer) electrodes.

FIG. 11(*t*) shows polysilicon 1111 is deposited over the structure shown in FIG. 11(*s*), and thereafter CMP may be used to planarize the top surface of the structure to expose the oxide over the nanofin 1101 and the top of the silicon cantilever 1112 within the nanofin 1101. Further, implantation is carried out.

FIG. 11(*u*) shows that oxide in the nanofin 1101 is released by HF vapour, thereby leaving the silicon cantilever 1112 to be freestanding over the substrate 1180.

FIG. 11(*v*) shows the cross section view of the structure as shown in FIG. 11(*u*). As can be seen, in this embodiment, the top electrodes are closer to the silicon cantilever 1112 compared with the bottom electrodes 1108.

Figure 12:
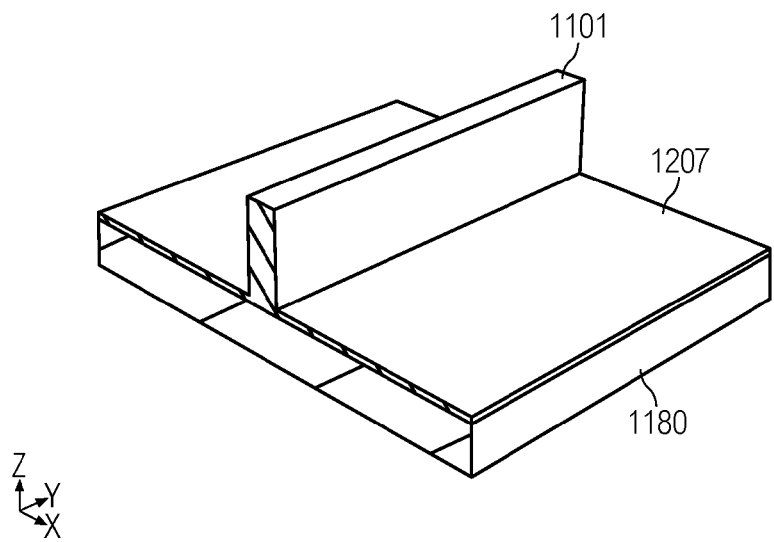
Figure 12:
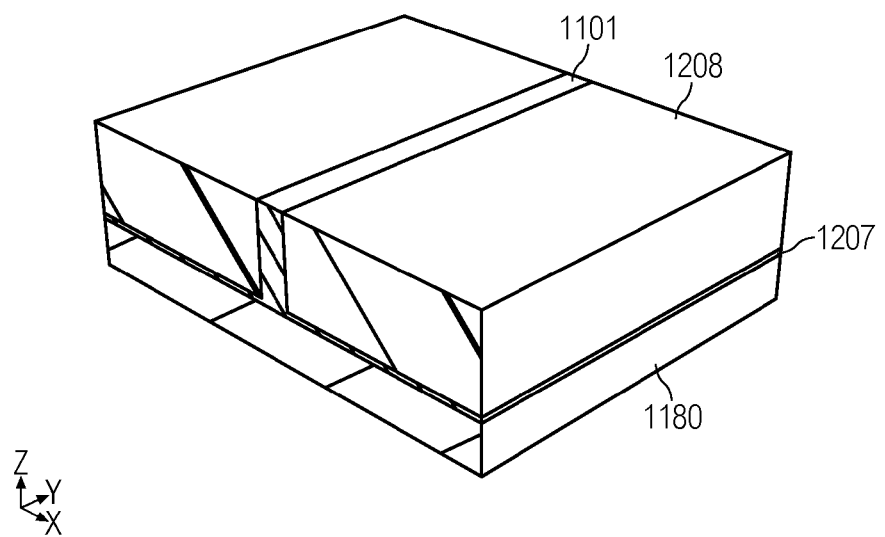
Figure 12:
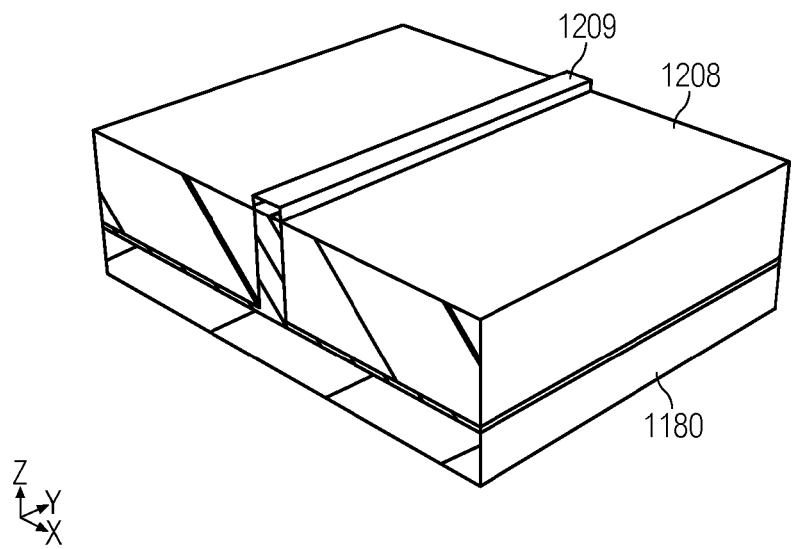
Figure 12:
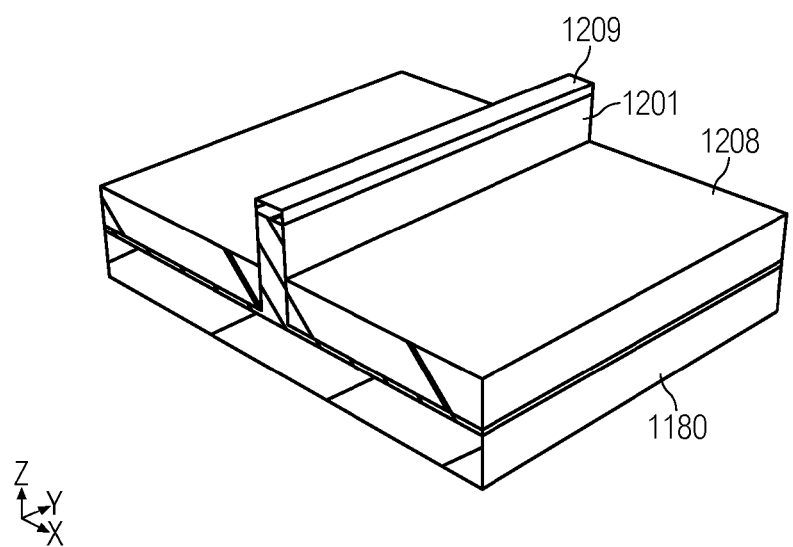
Figure 12:
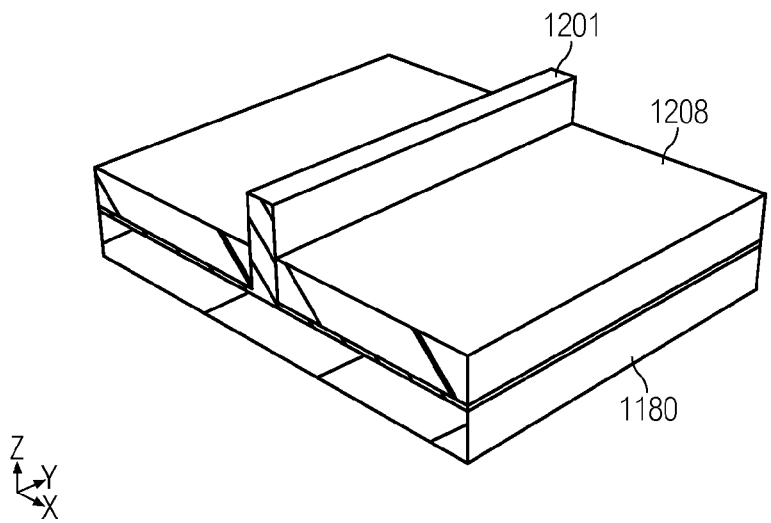
Figure 12:
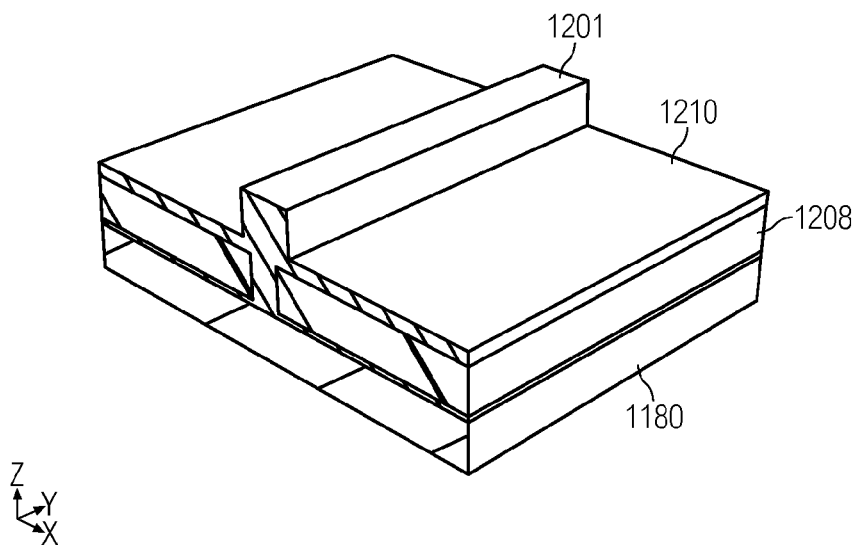
Figure 12:
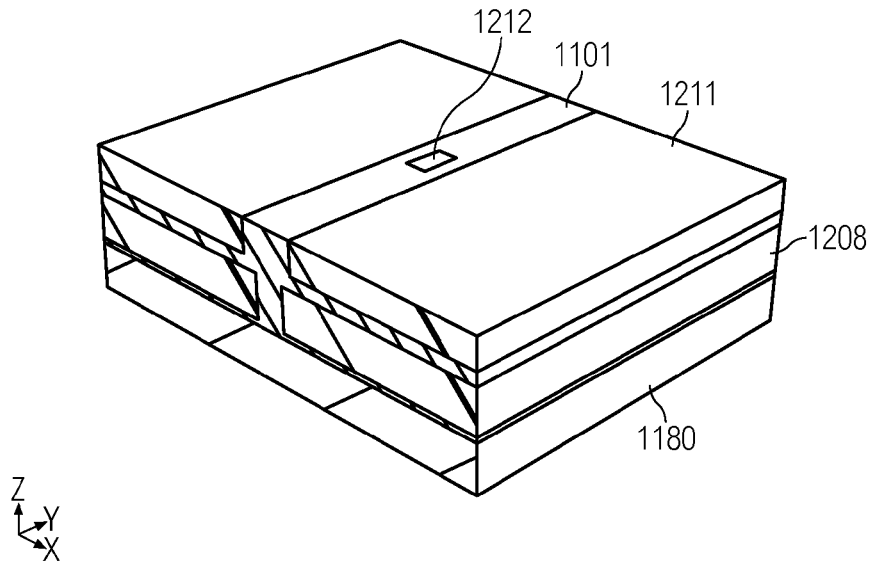
Figure 12:
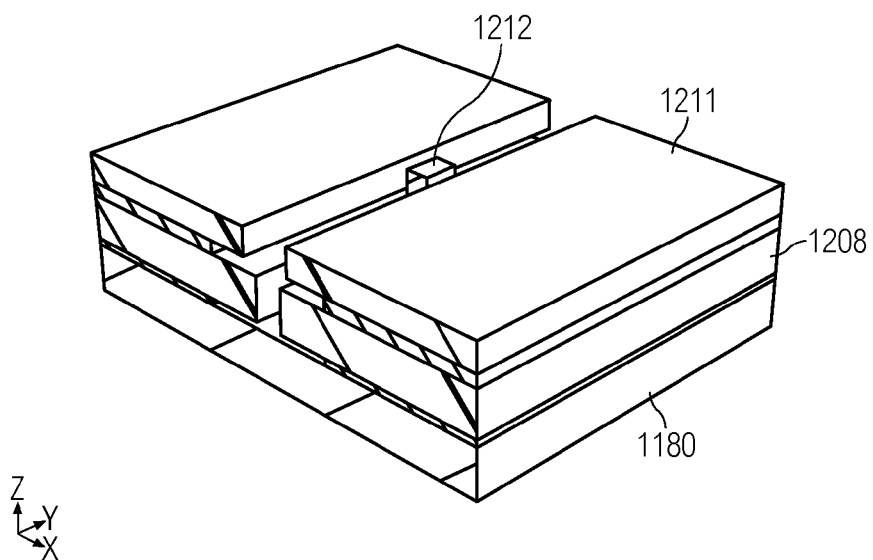
Figure 12:
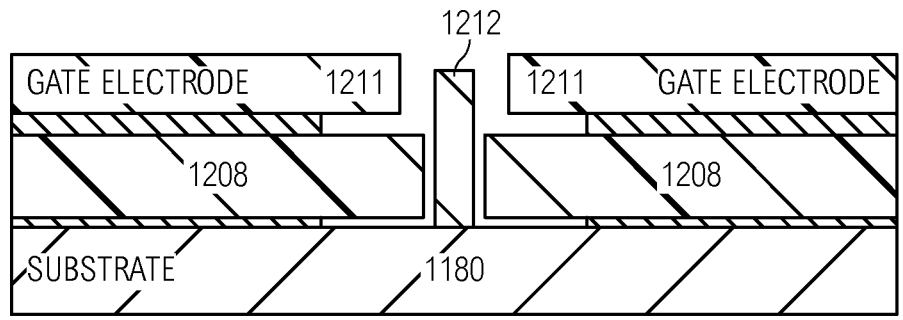

The fabrication process of the switching device 1000 shown in FIGS. 10(*a*) and (*b*) is shown in FIGS. 11(*a*) to (*k*) and FIGS. 12(*l*) to (*t*). In other words, until step as shown in FIG. 11(*k*), the fabrication process for the switching device 900 is the same as for the switching device 1000.

FIG. 12(*l*) shows that after step shown in FIG. 11(*k*), TEOS oxide 1207 is deposited over the structure shown in FIG. 11(*k*). The thickness of the deposited TEOS oxide layer defines the gap between the silicon cantilever (beam) and bottom electrode (e.g. contact layers 1010 and 1011 as shown in FIG. 10). Oxide layer 1207 may be set to be relatively thin when it is desired that the bottom electrode is closer to the cantilever compared with the top electrode.

FIG. 12(*m*) shows that polysilicon 1208 is deposited over the structure shown in FIG. 12(*l*) to form bottom electrode, and thereafter CMP may be used to planarize the top surface of the structure to expose the oxide over the nanowall 1101.

FIG. 12(*n*) shows that lithography mask 1209 is placed over the nanowall 1101.

FIG. 12(*o*) shows part of the polysilicon 1208 is etched away by DRIE.

FIG. 12(*p*) shows PR 1209 is stripped off, and implantation is carried out.

FIG. 12(*q*) shows oxide 1210 is deposited over the structure shown in FIG. 12(*p*) in order to isolate top and bottom electrodes. The gap between the silicon cantilever and top electrode may be defined by the thickness of the oxide 1210 deposited.

FIG. 12(*r*) shows that polysilicon 1211 is deposited over the structure shown in FIG. 12(*q*) so as to form the top electrodes, and thereafter CMP may be used to planarize the top surface of the structure to expose the oxide over the nanofin 1101 and the top of silicon cantilever 1212. Further, implantation is carried out.

FIG. 12(*s*) shows that oxide in the nanofin 1101 is released by HF vapour, thereby leaving the silicon cantilever 1212 to be freestanding over the substrate 1180.

FIG. 12(*t*) shows the cross section view of the switching device as shown in FIG. 12(*s*). As can be see, in this embodiment, the bottom electrodes 1208 are closer to the cantilever 1212 compared with the top electrodes 1211.

Figure 13:
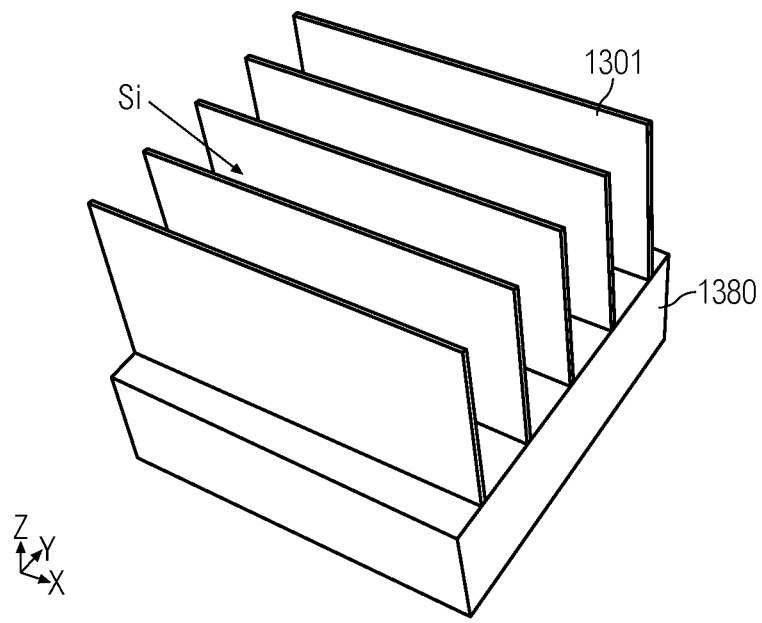
Figure 13:
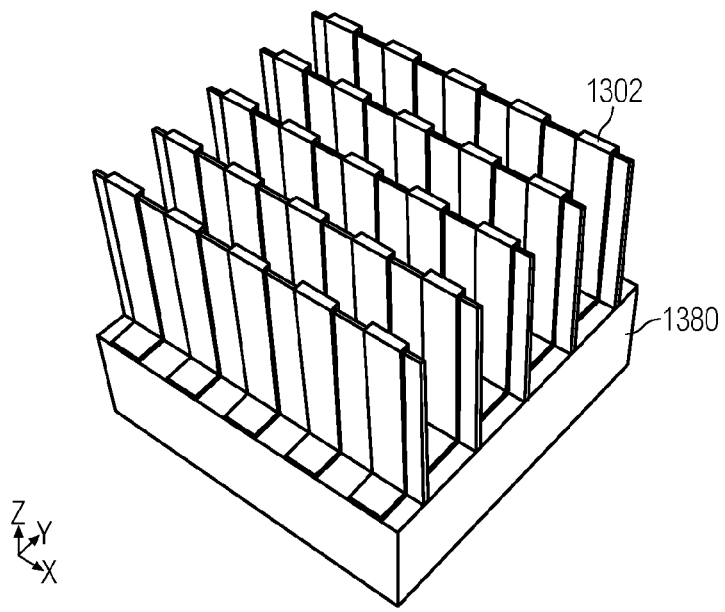
Figure 13:
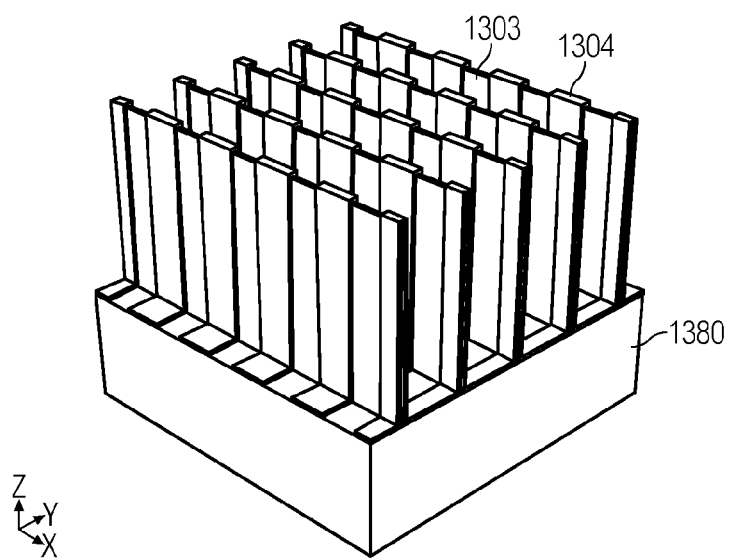
Figure 13:
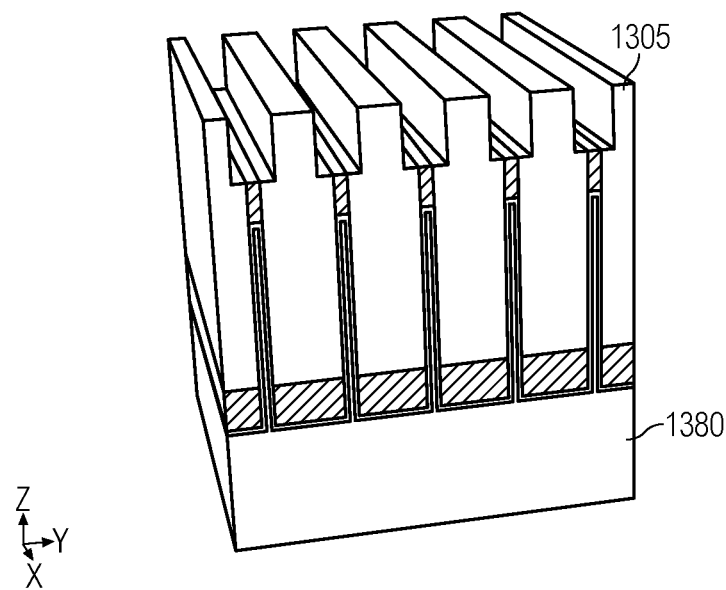

FIGS. 13(*a*) to (*d*) illustrate the fabrication process of an array of switching devices 200 as described herein.

FIG. 13(*a*) shows that a plurality of nanofins (nanowalls) 1301 are formed over a substrate 1380, e.g. by PR trim etch, and thermal oxidation.

FIG. 13(*b*) shows that a plurality of nitride strips 1302 are coated over the structure shown in FIG. 13(*a*) according to a pattern.

FIG. 13(*c*) shows that thermal oxidation is carried out for the structure shown in FIG. 13(*b*), and thereafter the nitride strips 1302 are stripped off. As a result each nanofin has alternating sections of silicon 1303 and thermal oxide 1304.

FIG. 13(*d*) shows that oxide is deposited over the structure shown in FIG. 13(*c*), and thereafter polysilicon 1305 is deposited. Thereafter CMP is used to planarize the top surface of the structure to expose the oxide over the nanofins 1301. Further, the oxide can be further released in order to leave a plurality of freestanding silicon cantilevers (not shown).

Figure 14:
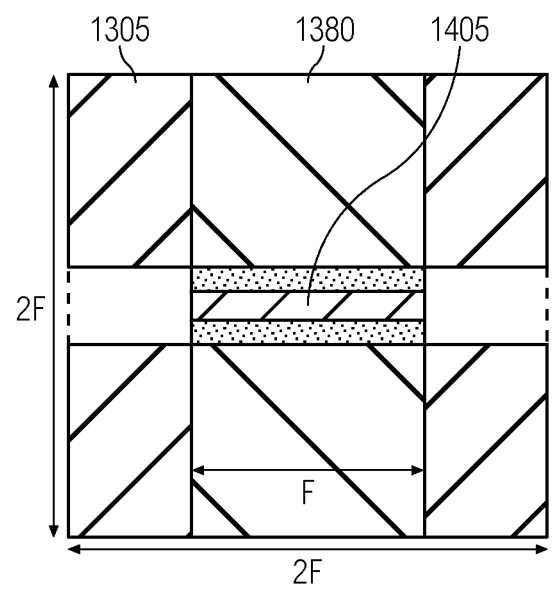
FIG. 14(a) shows the top view of a switching device fabricated according to the process illustrated in FIGS. 13(a) to (d)
FIG. 14(b) shows the top view of an array of switching devices fabricated according to the process illustrated in FIG. 13(a) to (d).
Figure 14:
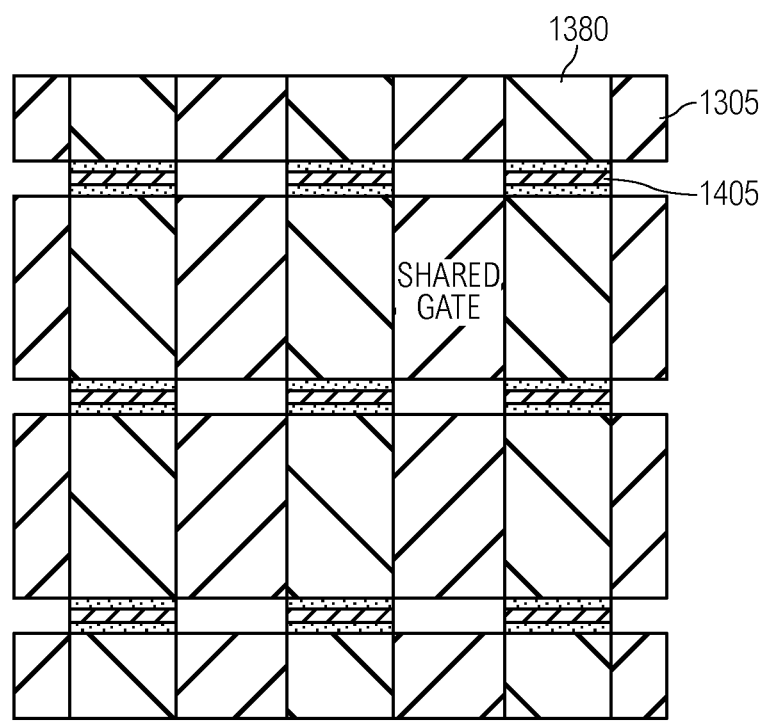

FIG. 14(*a*) shows the top view of a single cell among the array of switching devices formed from the process shown in FIGS. 13(*a*) to (*d*). 'F' in FIG. 14(*a*) represents the feature size. A minimum cell size of $4F^2$ is achievable. 1405 represents the freestanding silicon cantilever, the substrate 1380 may function as source, and the deposited polysilicon 1305 may function as gate.

FIG. 14(*b*) shows the top view of an array of switching devices formed from the process shown in FIGS. 13(*a*) to (*d*). As can be seen, the switching devices may have shared gate 1305. Shared gate architecture has the advantage of achieving small cell size.

Various embodiments provide a vertical silicon sublithographic cantilever switch with CMOS-compatible fabrication. Array design and fabrication steps are presented to achieve a minimum cell size of $4F^2$. Applying CMOS-compatible vertical cantilever to NEMS using a "top-down" etching approach have the common difficulties of high aspect ratio and lithographic resolution for a nano cantilever with reasonable actuation voltage. Array design and fabrication steps to achieve a minimum cell size of $4F^2$. PR trim and thermal oxidation to achieve sublithographic dimensions. Memory operation (read/write/erase) based on this new structure.

The switching device as described herein may be fabricated using a CMOS compatible fabrication process. The cell size (the size of each switching device as described herein) is competitive with Flash memory cell and can be scaled to less than 20 nm. The speed of reading or writing or erasing is fast and may take several nanoseconds. Further, the switching device as described herein may withstand harsh working environments such as high temperatures.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

We claim:

1. A switching device comprising:
    a substrate comprising a contact region;
    a vertical layer arrangement extending from the substrate next to the contact region, the vertical layer arrangement comprising a control layer; and
    a freestanding silicon cantilever extending vertically from the contact region;
    wherein the vertical layer arrangement further comprises a contact layer and the cantilever extends vertically next to the control layer and the contact layer of the layer arrangement;
    wherein the vertical layer arrangement further comprises an isolating layer, the contact layer is isolated from the control layer by the isolating layer;
    wherein the cantilever and the contact layer are configured to be maintained at the same potential upon contact of the cantilever with the contact layer when a voltage difference between the contact region and the control layer is applied.

2. The switching device of claim 1, wherein the cantilever is adapted such that it can be brought into contact electrostatically with the contact layer by applying the voltage difference between the contact region and the control layer.

3. The switching device of claim 2, wherein the cantilever is adapted such that when it has been brought into contact with the contact layer it stays in contact with the contact layer when the voltage is no longer applied.

4. The switching device of claim 3, wherein the cantilever is adapted such that it stays in contact by means of van der Waals force and/or Casimir effect.

5. The switching device of claim 1, wherein the substrate is silicon.

6. The switching device of claim 1, wherein the cantilever is electrically connected and mechanically fixed to the contact region.

7. The switching device of claim 1, comprising a further vertical layer arrangement formed on the substrate next to the contact region opposite the vertical layer arrangement, the further vertical layer arrangement comprising a further contact layer and further control layer such that the cantilever extends between the vertical layer arrangement and the further vertical layer arrangement.

8. The switching device of claim 7, wherein the cantilever is adapted such that it can be brought electrostatically in contact with the further contact layer by applying a voltage difference between the contact region and the further control layer.

* * * * *